(12) United States Patent
Cao et al.

(10) Patent No.: US 11,990,481 B2
(45) Date of Patent: May 21, 2024

(54) ARRAY SUBSTRATE AND MANUFACTURING METHOD THEREOF, DISPLAY PANEL AND BACKLIGHT MODULE

(71) Applicant: BOE TECHNOLOGY GROUP CO., LTD., Beijing (CN)

(72) Inventors: Zhanfeng Cao, Beijing (CN); Ke Wang, Beijing (CN); Zhiwei Liang, Beijing (CN); Jianguo Wang, Beijing (CN); Guocai Zhang, Beijing (CN); Xinhong Lu, Beijing (CN); Qi Qi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 429 days.

(21) Appl. No.: 17/418,945

(22) PCT Filed: Sep. 18, 2020

(86) PCT No.: PCT/CN2020/116213
§ 371 (c)(1),
(2) Date: Jun. 28, 2021

(87) PCT Pub. No.: WO2022/056842
PCT Pub. Date: Mar. 24, 2022

(65) Prior Publication Data
US 2022/0310660 A1  Sep. 29, 2022

(51) Int. Cl.
*H01L 27/12* (2006.01)
*G02F 1/13357* (2006.01)
(Continued)

(52) U.S. Cl.
CPC ...... *H01L 27/124* (2013.01); *G02F 1/133603* (2013.01); *H01L 25/0753* (2013.01);
(Continued)

(58) Field of Classification Search
CPC .................. H01L 33/62; H01L 2933/0066
See application file for complete search history.

(56) References Cited

U.S. PATENT DOCUMENTS 10,177,030 B2    1/2019   Amanapu et al.
10,373,867 B2    8/2019   Amanapu et al.
(Continued)

FOREIGN PATENT DOCUMENTS

CN    103456802 A   * 12/2013  ............. Y02P 70/50
CN    103456802 A    12/2013
(Continued)

OTHER PUBLICATIONS

Machine translation, Chinese Pat. Pub. No. CN103456802A, translation date: Oct. 26, 2023, Espacenet, all pages. (Year: 2023).*
(Continued)

*Primary Examiner* — Victoria K. Hall
(74) *Attorney, Agent, or Firm* — Calfee, Halter & Griswold LLP

(57) ABSTRACT

The present disclosure provides an array substrate and a manufacturing method thereof, a display panel and a backlight module. The manufacturing method of the array substrate includes: providing a base substrate; forming a metal wiring layer on a side of the base substrate, the metal wiring layer including a first copper metal layer; forming a planarization layer on a side of the metal wiring layer away from the base substrate; forming a drive lead layer on a side of the planarization layer away from the base substrate, the drive lead layer being electrically connected to the metal wiring layer, the drive lead layer including a second copper metal layer with a thickness larger than that of the first copper metal layer; forming a functional device layer on a side of the drive lead layer away from the base substrate.

12 Claims, 10 Drawing Sheets

(51) Int. Cl.
    *H01L 25/075*     (2006.01)
    *H01L 27/15*     (2006.01)
    *H01L 33/62*     (2010.01)

(52) U.S. Cl.
    CPC .......... *H01L 27/127* (2013.01); *H01L 27/156* (2013.01); *H01L 33/62* (2013.01); *H01L 2933/0066* (2013.01)

(56) References Cited

U.S. PATENT DOCUMENTS

| | | | | |
|---|---|---|---|---|
| 2014/0191275 | A1* | 7/2014 | Aibara | H05K 3/4007 |
| | | | | 174/257 |
| 2018/0197773 | A1 | 7/2018 | Amanapu et al. | |
| 2018/0197774 | A1 | 7/2018 | Amanapu et al. | |
| 2020/0035147 | A1* | 1/2020 | Ban | G09G 3/32 |
| 2020/0110307 | A1* | 4/2020 | Chang | G09G 3/32 |
| 2021/0351353 | A1* | 11/2021 | Lu | H01L 21/77 |
| 2021/0398952 | A1* | 12/2021 | Zhang | H01L 29/78633 |

FOREIGN PATENT DOCUMENTS

| | | |
|---|---|---|
| CN | 109031779 A | 12/2018 |
| CN | 110972495 A | 4/2020 |
| IN | 103456802 B | 9/2015 |
| WO | 2020227861 A1 | 11/2020 |

OTHER PUBLICATIONS

Translation, Written Opinion of the International Searching Authority, International Searching Authority, International application No. PCT/CN2020/116213, dated Jun. 23, 2021, all pages. (Year: 2021).*
Translation, International Search Report, International Searching Authority, International application No. PCT/CN2020/116213, dated Jun. 24, 2021, all pages. (Year: 2021).*
Written Opinion from PCT/CN2020/116213 dated Jun. 23, 2021 (3 pages).

* cited by examiner

ARRAY SUBSTRATE AND MANUFACTURING METHOD THEREOF, DISPLAY PANEL AND BACKLIGHT MODULE

RELATED APPLICATIONS

This application is the 371 application of PCT Application No. PCT/CN2020/116213, filed Sep. 18, 2020, the entire contents of which are incorporated herein by reference.

TECHNICAL FIELD

The present disclosure relates to display technologies, and in particular, to an array substrate, a method for manufacturing the array substrate, a display panel and a backlight module.

BACKGROUND

When manufacturing a Mini LED (mini light-emitting diode) substrate, a drive lead layer may be first provided on a substrate, and then a metal wiring layer is formed on a side of the drive lead layer away from the substrate. A device pad is provided on the metal wiring layer and connected with the LED. In order to meet the requirements of Mini LEDs for high current loads, the drive lead layer is usually formed by copper and has a relatively large thickness. However, the increase in the thickness of the copper layer will increase the stress of the substrate, which will cause the substrate to warp and affect the normal manufacturing processes.

It should be noted that the information disclosed in the Background section above is only for enhancing the understanding of the background of the present disclosure, and thus may include information that does not constitute prior art known to those of ordinary skill in the art.

SUMMARY

Embodiments of the present disclosure provide the following technical solutions.

According to a first aspect of the present disclosure, there is provided an array substrate, including:
  a base substrate;
  a metal wiring layer provided on a side of the base substrate and including a first copper metal layer;
  a planarization layer provided on a side of the metal wiring layer away from the base substrate;
  a drive lead layer provided on a side of the planarization layer away from the base substrate, wherein the drive lead layer is electrically connected to the metal wiring layer, the drive lead layer includes a second copper metal layer, and a thickness of the second copper metal layer is greater than a thickness of the first copper layer;
  a functional device layer provided on a side of the drive lead layer away from the base substrate, wherein the functional device layer is electrically connected to the metal wiring layer or the drive lead layer.

According to an exemplary embodiment of the present disclosure, the metal wiring layer includes a connection lead and a device pad electrically connected to the connection lead;
  the drive lead layer includes a drive lead electrically connected to the connection lead.

According to an exemplary embodiment of the present disclosure, the metal wiring layer includes a connection lead;
  the drive lead layer includes a drive lead and a device pad, and both the drive lead and the device pad are electrically connected to the connection lead.

According to a second aspect of the present disclosure, there is provided a backlight module, including the array substrate described above, and the functional device is a micro light emitting diode or a mini light emitting diode.

According to a third aspect of the present disclosure, there is provided a display panel, including the array substrate described above, and the functional device is a micro light emitting diode or a mini light emitting diode.

According to a fourth aspect of the present disclosure, there is provided a method for manufacturing an array substrate, including:
  providing a base substrate;
  forming a metal wiring layer on a side of the base substrate, the metal wiring layer including a first copper metal layer;
  forming a planarization layer on a side of the metal wiring layer away from the base substrate;
  forming a drive lead layer on a side of the planarization layer away from the base substrate, wherein the drive lead layer is electrically connected to the metal wiring layer, the drive lead layer includes a second copper metal layer, and a thickness of the second copper metal layer is greater than a thickness of the first copper layer;
  forming a functional device layer on a side of the drive lead layer away from the base substrate, wherein the functional device layer is electrically connected to the metal wiring layer or the drive lead layer.

According to an exemplary embodiment of the present disclosure, forming the metal wiring layer on the side of the base substrate includes: forming the metal wiring layer on the side of the base substrate, the metal wiring layer including a connection lead;
  forming the drive lead layer on the side of the planarization layer away from the base substrate includes:
  forming the drive lead layer on the side of the planarization layer away from the base substrate, wherein the drive lead layer includes a drive lead and a device pad, and both the drive lead and the device pad are electrically connected to the connection lead.

According to an exemplary embodiment of the present disclosure, forming the planarization layer on the side of the metal wiring layer away from the base substrate includes:
  forming the planarization layer on the side of the metal wiring layer away from the base substrate, wherein the planarization layer has a first via hole and a second via hole exposing the connection lead;
  forming the drive lead layer on the side of the planarization layer away from the base substrate includes:
  forming a seed metal layer on the side of the planarization layer away from the base substrate, wherein the seed metal layer includes a device pad seed layer and a drive lead seed layer, the device pad seed layer is electrically connected to the connection lead through the first via hole, and the drive lead seed layer is electrically connected to the connection lead through the second via hole;
  forming a copper growth layer on a side of the seed metal layer away from the base substrate using an electroless copper plating method, wherein the copper growth layer includes a device pad growth layer on a surface of the device pad seed layer away from the base substrate and a drive lead growth layer on a surface of the drive lead seed layer away from the base substrate.

According to an exemplary embodiment of the present disclosure, forming the metal wiring layer on the side of the base substrate includes: forming the metal wiring layer on the side of the base substrate, the metal wiring layer including a connection lead and a device pad electrically connected to the connection lead;
forming the drive lead layer on the side of the planarization layer away from the base substrate includes:
forming a drive lead layer on the side of the planarization layer away from the base substrate, wherein the drive lead layer includes a drive lead electrically connected to the connection lead.

According to an exemplary embodiment of the present disclosure, forming the drive lead layer on the side of the planarization layer away from the base substrate includes:
forming a seed metal layer on the side of the planarization layer away from the base substrate, wherein the seed metal layer includes a drive lead seed layer; and
forming a copper growth layer on a side of the seed metal layer away from the base substrate using a copper electroplating method, wherein the copper growth layer includes a drive lead growth layer on a surface of the drive lead seed layer away from the base substrate;
forming the planarization layer on the side of the metal wiring layer away from the base substrate includes:
forming a planarization precursor layer on the side of the metal wiring layer away from the base substrate, wherein the planarization precursor layer has a third via hole exposing the connection lead, so that the seed metal layer is electrically connected to the connection lead through the third via hole; and
after forming the seed metal layer, forming a fourth via hole on the planarization precursor layer, wherein the fourth via hole exposes the device pad.

According to an exemplary embodiment of the present disclosure, forming the metal wiring layer on the side of the base substrate includes:
forming the metal wiring layer on the side of the base substrate, wherein the metal wiring layer includes the first copper metal layer and a protective metal layer arranged on a surface of the first copper metal layer away from the base substrate, and a material of the protective metal layer is nickel or copper-nickel alloy;
wherein forming the fourth via hole on the planarization precursor layer includes:
after forming the seed metal layer and before forming the copper growth layer, forming the fourth via hole on the planarization precursor layer.

According to an exemplary embodiment of the present disclosure, providing the base substrate includes: providing a first mother board substrate, wherein the first mother board substrate includes base substrates of a plurality of array substrates;
forming the metal wiring layer on the side of the base substrate includes:
forming the metal wiring layer of each of the array substrates on a side of the first mother board substrate;
forming the planarization layer on the side of the metal wiring layer away from the base substrate includes:
forming the planarization layer of each of the array substrates on the side of each of metal wiring layers away from the base substrate;
forming the drive lead layer on the side of the planarization layer away from the base substrate includes:
forming the seed metal layer of each of the array substrates on the side of each of planarization layers away from the base substrate;
after forming the seed metal layer, dividing the first mother board substrate into a plurality of second mother board substrates, wherein any one of the second mother board substrates includes the base substrate of at least one of the array substrates; and
forming a copper growth layer of each of the array substrates on a side of each of seed metal layers of the second mother board substrates away from the base substrate.

BRIEF DESCRIPTION OF THE DRAWINGS

The above and other features and advantages of the present disclosure will become more apparent by describing example embodiments in detail with reference to the accompanying drawings.

Figure 1:
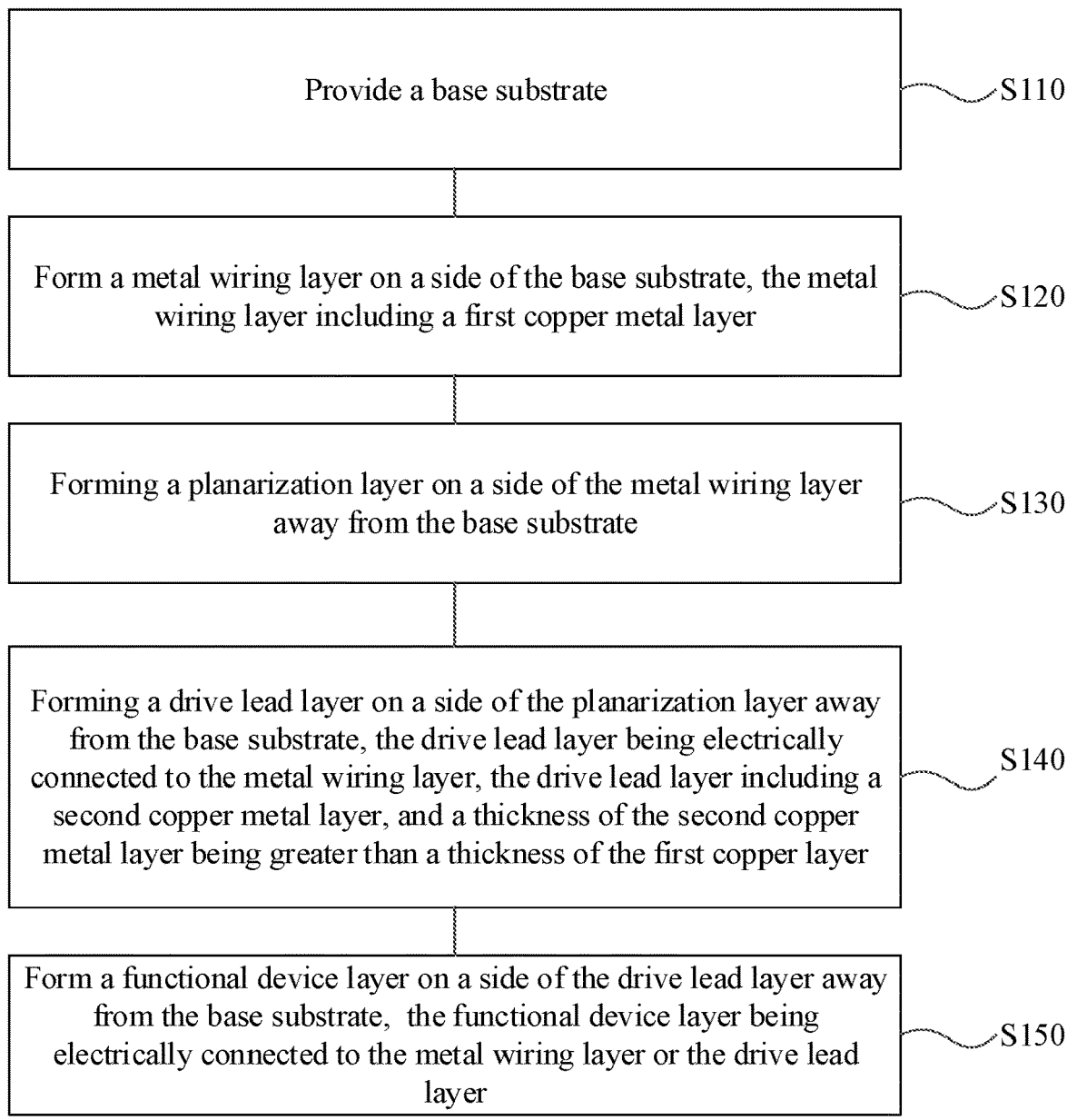
FIG. 1 is a schematic flowchart of a method for manufacturing an array substrate according to an embodiment of the present disclosure.

Reference signs of main components in figures are listed as follows: 100: base substrate; 200: metal wiring layer; 210: first protective metal layer; 220: first copper metal layer; 230: second protective metal layer; 240: third protective metal layer; 301: first via hole; 302: second via hole; 303: third via hole; 304: fourth via hole; 305: fifth via hole; 310: first passivation layer; 311: first passivation precursor layer; 320: planarization layer; 321: planarization precursor layer; 400: drive lead layer; 401: second copper metal layer; 410: seed metal layer; 411: fourth protective metal layer; 412: copper seed layer; 420: copper growth layer; 430: fifth protective metal layer; 510: functional device layer; 511: functional device; 520: drive chip layer; 521: drive chip; 610: protective layer; 620: connection structure; 710: connection lead; 7101: first connection lead; 7102: second connection lead; 7103: third connection lead; 7104: fourth connection lead; 7105: fifth connection lead; 720: drive lead; 7201: first drive lead; 7202: second drive lead; 721: drive lead seed layer; 722: drive lead growth layer; 730: device pad; 731: device pad seed layer; 732: device pad growth layer; 740: chip pad; 7401: first chip pad; 7402: second chip pad; 7403: third chip pad; 7404: fourth chip pad; A: first mother board substrate; B: second mother board substrate; C: functional area; D: first direction; E: second direction.

DETAILED DESCRIPTION

Example embodiments will now be described more fully with reference to the accompanying drawings. However, the embodiments can be implemented in a variety of forms and should not be construed as being limited to the examples set forth herein; rather, these embodiments are provided so that the present disclosure will be more complete so as to convey the idea of the exemplary embodiments to those skilled in this art. The described features, structures, or characteristics in one or more embodiments may be combined in any suitable manner. In the following description, many specific details are provided to give a full understanding of the embodiments of the present disclosure.

In figures, the thicknesses of regions and layers may be exaggerated for clarity. The same reference signs in the figures represent the same or similar structures, and thus their repeated descriptions will be omitted.

The described features, structures, or characteristics in one or more embodiments may be combined in any suitable manner. In the following description, many specific details are provided to give a full understanding of the embodiments of the present disclosure. However, those skilled in the art will realize that the technical solutions of the present disclosure may be practiced without one or more of the specific details, or other methods, components, materials, etc. may be used. In other instances, well-known structures, materials or operations are not shown or described in detail to avoid obscuring aspects of the present disclosure.

When a structure is mentioned as being "on" another structure, it may mean that the structure is integrally formed on the another structure, or that the structure is "directly" provided on the another structure, or that the structure is "indirectly" provided on the another other structure through other structure(s).

The terms "first" and "second" are only used as markers and do not constitute a limitation on the number of objects.

In embodiments of the present disclosure, any film or layer may include a side surface, a surface close to a base substrate and a surface far away from the base substrate. The surface close to the base substrate and the surface away from the base substrate are connected by the side surface of the film or layer. In embodiments of the present disclosure, the thickness of any one film or layer refers to the size of the film or layer in the direction perpendicular to the base substrate.

In embodiments of the present disclosure, a film or layer can be described from different perspectives such as a layout perspective and a pattern perspective. When describing a film or layer from the layout perspective, various sub-layers that make up the film or layer are described, or the material composition or material change of the film or layer in the direction perpendicular to the base substrate is described. When describing a film or layer from the pattern perspective, the structures such as leads, pads, vias, etc. or other structures that the film or layer can form are described, or the pattern of the film or layer is described from a bird eye view.

Figure 2:
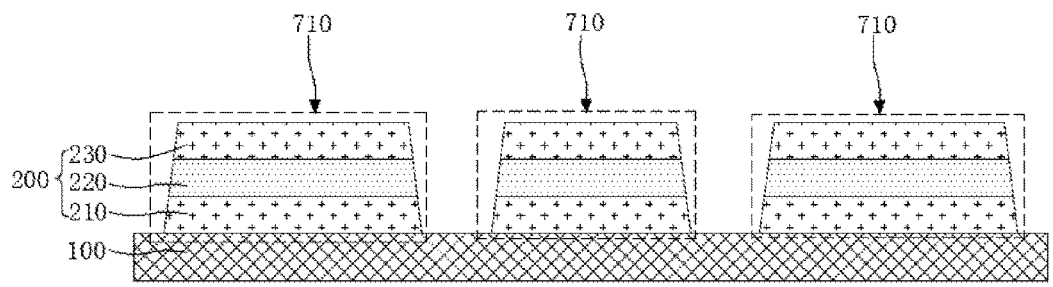
FIG. 2 is a schematic structural diagram showing forming of a metal wiring layer according to an embodiment of the present disclosure.
Figure 10:
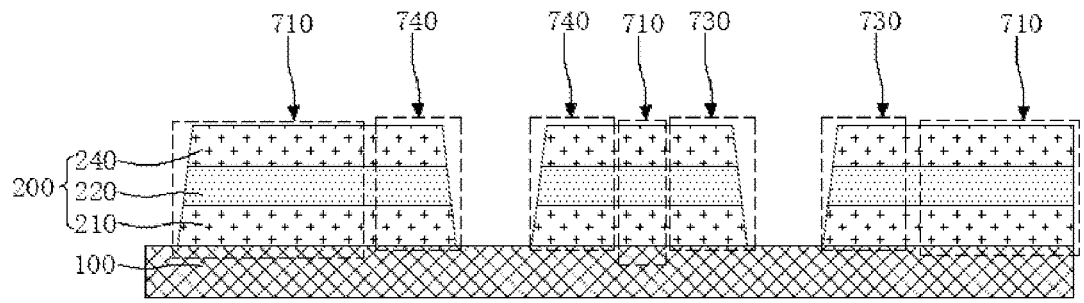
FIG. 10 is a schematic structural diagram showing forming of a metal wiring layer according to an embodiment of the present disclosure.

An embodiment of the present disclosure provides a method for manufacturing an array substrate. As shown in FIG. 1, the method for manufacturing the array substrate includes the following steps:

In step S110, as shown in FIGS. 2 and 10, a base substrate 100 is provided.

In step S120, as shown in FIGS. 2 and 10, a metal wiring layer 200 is formed on a side of the base substrate 100, and the metal wiring layer 200 includes a first copper metal layer 220.

Figure 3:
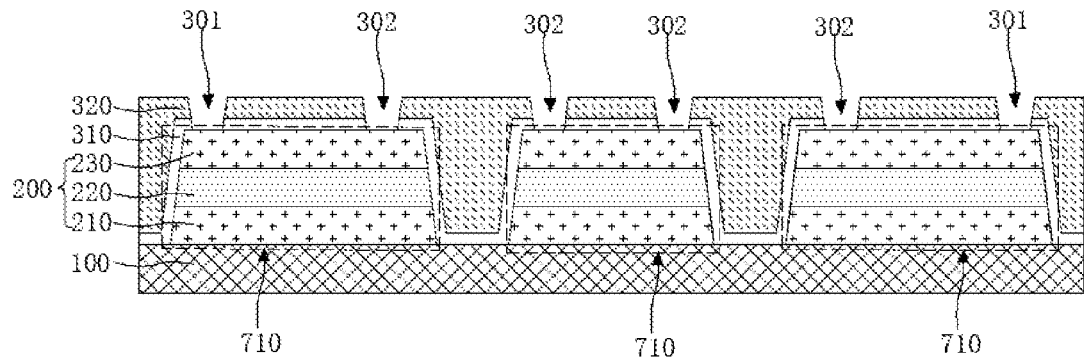
FIG. 3 is a schematic structural diagram showing forming of a planarization layer according to an embodiment of the present disclosure.
Figure 11:
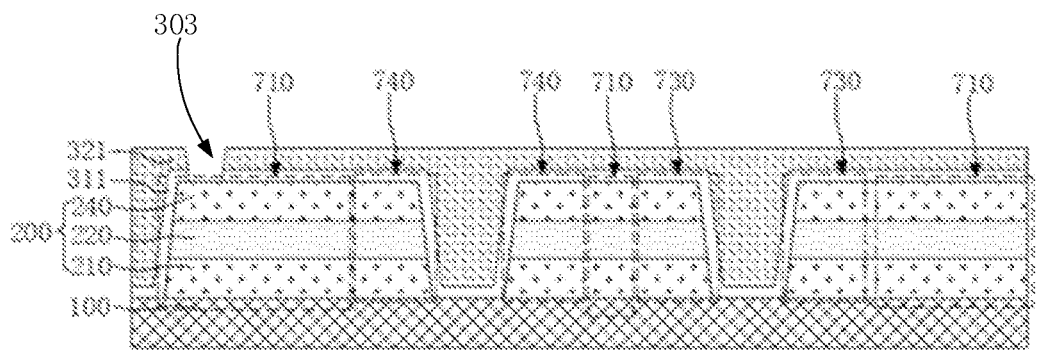
FIG. 11 is a schematic structural diagram showing forming of a planarization precursor layer according to an embodiment of the present disclosure.
Figure 13:
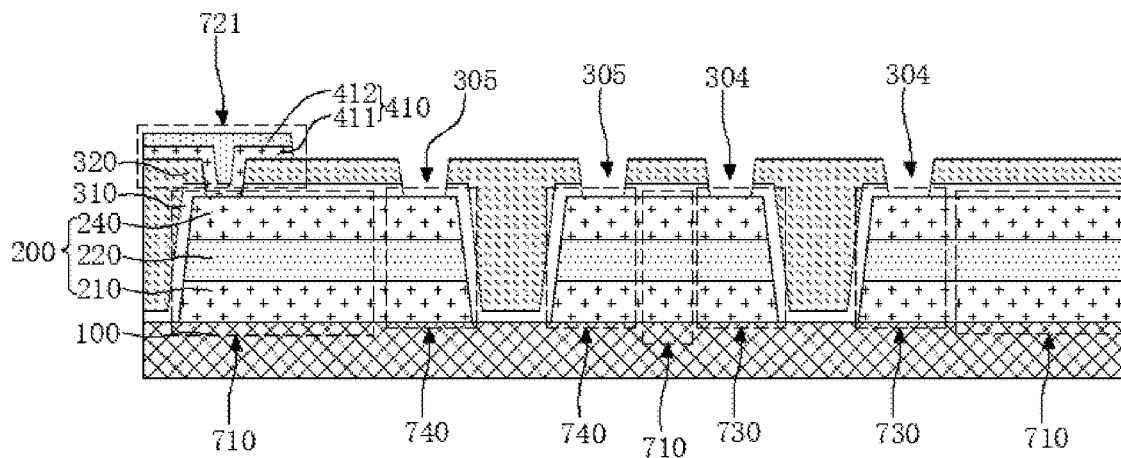
FIG. 13 is a schematic structural diagram showing forming of a planarization layer according to an embodiment of the present disclosure.

In step S130, as shown in FIGS. 3 and 11 and FIG. 13, a planarization layer 320 is formed on a side of the metal wiring layer 200 away from the base substrate 100.

Figure 4:
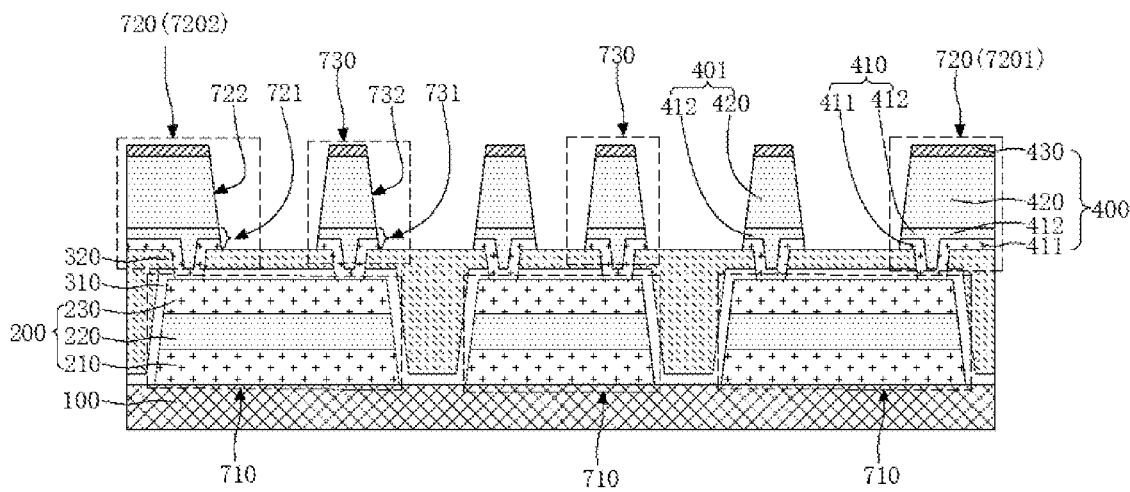
FIG. 4 is a schematic structural diagram showing forming of a drive lead layer according to an embodiment of the present disclosure.
Figure 14:
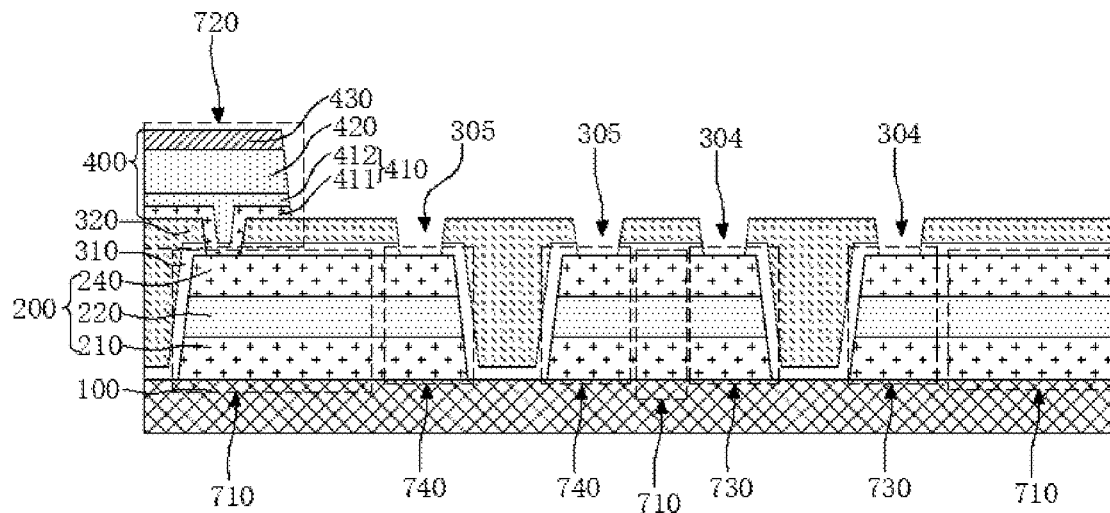
FIG. 14 is a schematic structural diagram showing forming of a copper growth layer according to an embodiment of the present disclosure.

In step S140, as shown in FIGS. 4 and 14, a drive lead layer 400 is formed on a side of the planarization layer 320 away from the base substrate 100, and the drive lead layer 400 is electrically connected to the metal wiring layer 200. The drive lead layer 400 includes a second copper metal layer 401, and the thickness of the second copper metal layer 401 is greater than the thickness of the first copper metal layer 220.

Figure 6:
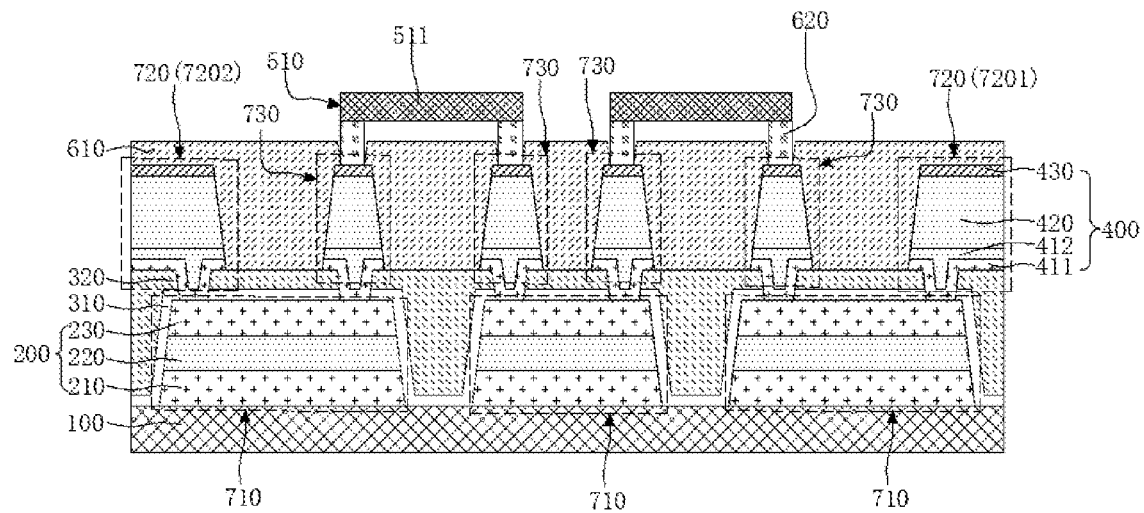
FIG. 6 is a schematic structural diagram showing forming of a functional device layer according to an embodiment of the present disclosure.
Figure 16:
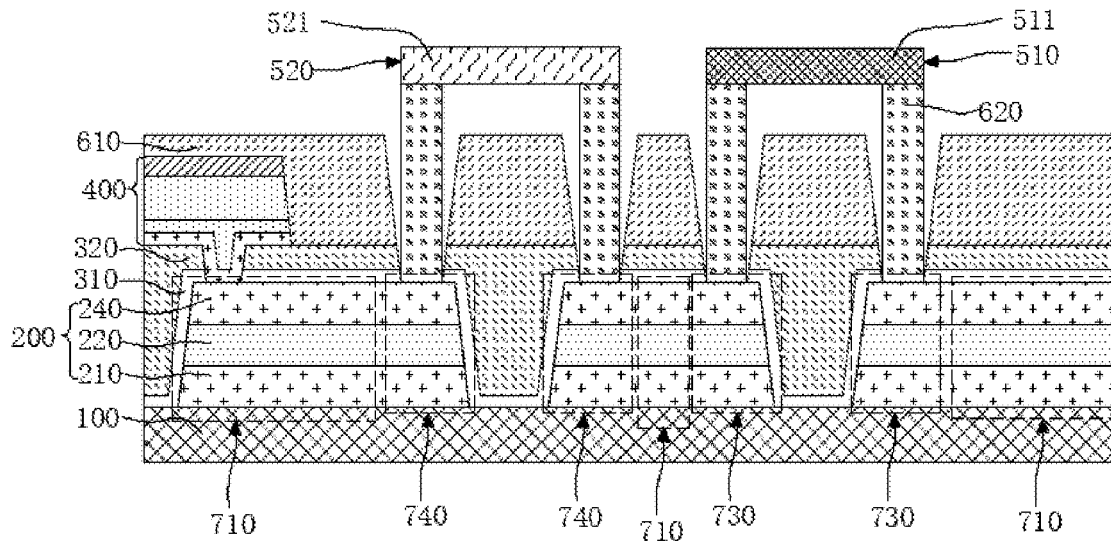
FIG. 16 is a schematic structural diagram showing setting of a functional device layer and a drive chip layer according to an embodiment of the present disclosure.

In step S150, as shown in FIGS. 6 and 16, a functional device layer 510 is provided on a side of the drive lead layer 400 away from the base substrate 100, and the functional device layer 510 is electrically connected to the metal wiring layer 200 or the drive lead layer 400.

In the method for manufacturing the array substrate according to the embodiment of the present disclosure, the metal wiring layer 200 is formed first, and then the drive lead layer 400 is formed. Since the thickness of the first copper metal layer 220 in the metal wiring layer 200 is relatively small, the stress of the base substrate 100 can be reduced, and problems such as warping and damage of the base substrate 100 under high stress can be avoided. The second copper metal layer in the drive lead layer 400 has a relatively large thickness and thus can have a low resistance, thereby meeting the current load requirement of the functional device 511. Therefore, the manufacturing method of the array substrate according to the embodiment of the present disclosure can not only form the second copper metal layer with a large thickness to meet the electrical requirements of the array substrate, but also avoid providing the second copper metal layer on the surface of the base substrate 100. In this way, the manufacturing method can satisfy the requirements of the manufacturing processes well.

According to the manufacturing method of the array substrate according to some embodiments of the present disclosure, as shown in FIG. 6 and FIG. 16, the manufactured array substrate includes a base substrate 100, a metal wiring layer 200, a drive lead layer 400 and a function device layer 510 which are sequentially stacked. The metal wiring layer 200 is provided on a side of the base substrate 100. The metal wiring layer 200 includes a first copper metal layer 220. The planarization layer 320 is provided on a side of the metal wiring layer 200 away from the base substrate 100. The drive lead layer 400 is provided on a side of the planarization layer 320 away from the base substrate 100, and the drive lead layer 400 is electrically connected to the metal wiring layer 200. The drive lead layer 400 includes a second copper metal layer 401, and the thickness of the second copper metal layer 401 is greater than the thickness of the first copper metal layer 220. The functional device layer 510 is provided on a side of the drive lead layer 400 away from the base substrate 100, and the functional device layer 510 is electrically connected to the metal wiring layer 200 or the drive lead layer 400.

Hereinafter, the steps, principles, and effects of the manufacturing method of the array substrate according to embodiments of the present disclosure will be further explained and described with reference to the accompanying drawings.

In step S110, as shown in FIG. 2 and FIG. 10, a base substrate 100 may be provided. The base substrate 100 may be an inorganic material base substrate 100 or an organic material base substrate 100. For example, in an embodiment of the present disclosure, the material of the base substrate 100 may be a glass material such as soda-lime glass, quartz glass, sapphire glass, etc., or may be a metal material such as stainless steel, aluminum, nickel, etc. In another embodiment of the present disclosure, the material of the base substrate 100 may be polymethyl methacrylate (PMMA), polyvinyl alcohol (PVA), polyvinyl phenol (PVP), polyether sulfone (PES), polyimide, polyamide, polyacetal, polycarbonate (PC), polyethylene terephthalate (PET), polyethylene naphthalate (PEN) or a combination thereof. In another embodiment of the present disclosure, the base substrate 100 may also be a flexible base substrate 100. For example, the material of the base substrate 100 may be polyimide (PI). The base substrate 100 may be a composite of multiple layers of materials. For example, in an embodiment of the present disclosure, the base substrate 100 may include a bottom film, a pressure-sensitive adhesive layer, a first polyimide layer and a second polyimide layer which are sequentially stacked.

According to some embodiments, before forming the metal wiring layer 200, an insulating buffer layer may be formed on a side of the base substrate 100. For example, a silicon nitride layer, a silicon oxide layer, or a silicon oxynitride layer is formed. Then, the metal wiring layer 200 is formed on a side of the insulating buffer layer away from the base substrate 100. The insulating buffer layer can alleviate the stress applied to the base substrate 100 when the metal wiring layer 200 is formed, and can isolate water vapor.

In an embodiment of the present disclosure, the material of the base substrate 100 is glass, so that the base substrate 100 has a large size and low cost, which is convenient to be used as a backlight source of a direct-type backlight module and reduce the cost of the backlight module.

In step S120, as shown in FIGS. 2 and 10, the metal wiring layer 200 may be formed on a side of the base substrate 100. The metal wiring layer 200 may have a small thickness to avoid a large stress on the base substrate 100 caused by a large thickness. From the perspective of the in-layer structure, the metal wiring layer 200 may include the first copper metal layer 220. In some embodiments, the first copper metal material layer may be deposited and formed first, and then the first copper metal material layer may be patterned to form the first copper metal layer 220. According to some embodiments, the first copper metal material layer may be formed by a sputtering method. According to some embodiments, a patterning operation may be performed on the first copper metal material layer through a photolithography process. According to some embodiments, the thickness of the first copper metal layer 220 may be 2000-10000 angstroms. As an exemplary embodiment, the thickness of the first copper metal layer 220 may be 6000-9000 angstroms. As another exemplary embodiment, the thickness of the first copper metal layer 220 may be 6000 angstroms.

In some embodiments, from the perspective of the in-layer structure, the metal wiring layer 200 includes the first copper metal layer 220, and further includes at least one of a first protective metal layer 210 and a second protective metal layer 230. The first protective metal layer 210 may be located on a surface of the first copper metal layer 220 close to the base substrate 100, and the second protective metal layer 230 may be located on a surface of the first copper metal layer 220 away from the base substrate 100. The materials of the first protective metal layer 210 and the second protective metal layer 230 can be selected from molybdenum, molybdenum copper alloy, molybdenum-niobium alloy, molybdenum copper-niobium alloy or other metals or metal alloys. The materials of the first protective metal layer 210 and the second protective metal layer 230 may be the same or different. The first protective metal layer 210 and the second protective metal layer 230 can increase the adhesion between the first copper metal layer 220 and other films or layers. For example, the first protective metal layer 210 can increase the adhesion between the first copper metal layer 220 and the base substrate 100 or the insulating buffer layer, and the second protective metal layer 230 may increase the adhesion between the first copper metal layer 220 and the drive lead layer 400. According to some embodiments, the materials of the first protective metal layer 210 and the second protective metal layer 230 are both molybdenum-niobium alloys. The thickness of the first protective metal layer 210 and the second protective metal layer 230 may be 200 to 500 angstroms.

When preparing the metal wiring layer 200, a metal wiring material layer may be deposited first, and then a patterning operation is performed on the metal wiring material layer to obtain the patterned metal wiring layer 200. The composition of the metal wiring material layer corresponds to the required composition of the metal wiring layer 200. For example, as shown in FIG. 2, from the perspective of the in-layer structure, when the metal wiring layer 200 includes the first protective metal layer 210, the first copper metal layer 220, and the second protective metal layer 230 which are stacked, the metal wiring material layer includes a first protective metal material layer, a first copper metal material layer, and a second protective metal material layer which are stacked.

In some embodiments, as shown in FIG. 10, from the perspective of the in-layer structure, the metal wiring layer 200 includes the first protective metal layer 210, the first copper metal layer 220, and a third protective metal layer 240. The third protective metal layer 240 may be provided on a side of the first copper metal layer 220 away from the base substrate 100. The material of the third protective metal layer 240 may be copper-nickel alloy or nickel metal. The third protective metal layer 240 may prevent the first copper metal layer 220 from being oxidized. In some cases, for example, when the functional device 511 is electrically connected to the metal wiring layer 200, the third protective metal layer 240 can increase the adhesion between the functional device 511 and the metal wiring layer 200. The thickness of the third protective metal layer 240 may be 400-2000 angstroms.

According to some embodiments, the third protective metal layer 240 may be manufactured by sputtering, depositing, or electroless plating, or electroplating a third protective metal material layer and then patterning third protective metal material layer.

In an embodiment of the present disclosure, as shown in FIG. 2, from the perspective of the in-layer structure, the metal wiring layer 200 includes the first protective metal layer 210, the first copper metal layer 220 and the second protective metal layer 230 which are stacked on a side of the base substrate 200. The materials of the first protective metal layer 210 and the second protective metal layer 230 are both molybdenum-niobium alloy, the thicknesses of the first protective metal layer 210 and the second protective metal layer 230 are both 300 angstroms. When preparing the metal wiring layer 200, a first protective metal material layer, a first copper metal material layer, and a second protective metal material layer may be sequentially formed on a side of the base substrate 100 to form a metal wiring material layer. Then, a patterning operation is performed on the metal wiring material layer through a photolithography process to form the metal wiring layer 200.

In another embodiment of the present disclosure, as shown in FIG. 10, from the perspective of the in-layer structure, the metal wiring layer 200 includes the first protective metal layer 210, the first copper metal layer 220 and the third protective metal layer 240 which are sequentially stacked on a side of the base substrate 100. The material of the first protective metal layer 210 is the molybdenum-niobium alloy with a thickness of 300 angstroms. The material of the third protective metal layer 240 is the copper-nickel alloy with a thickness of 500 angstroms. When preparing the metal wiring layer 200, a first protective metal material layer, a first copper metal material layer, and a third protective metal material layer may be sequentially formed on a side of the base substrate 100 to form a metal wiring material layer. Then, a patterning operation is performed on the metal wiring material layer through a photolithography process to form the metal wiring layer 200.

In another embodiment of the present disclosure, from the perspective of the in-layer structure, the metal wiring layer 200 includes the first protective metal layer 210, the first copper metal layer 220, the second protective metal layer 230 and the third protective metal layer 240 which are sequentially stacked on a side of the base substrate 100. The materials of the first protective metal layer 210 and the second protective metal layer 230 are the molybdenum-niobium alloy and the material of the third protective metal layer 240 is the copper-nickel alloy. When preparing the metal wiring layer 200, a first protective metal material layer, a first copper metal material layer, a second protective metal material layer, and a third protective metal material layer can be sequentially formed on a side of the base substrate 100 to form a metal wiring material layer. Then, a patterning operation is performed on the metal wiring material layer through a photolithography process to form the metal wiring layer 200. In this embodiment, the third protective metal material layer can have an electrochemical effect with the first copper metal material layer through the second protective metal layer, and the electrons of the molybdenum-niobium alloy can be transferred to copper to increase the etching rate of the molybdenum-niobium alloy. The electrons of the copper-nickel alloy can be first transferred to the molybdenum-niobium alloy, and then transferred from the molybdenum-niobium alloy to copper, so that the etching rate of the copper-nickel alloy is increased. As a result, the etching rate of the metal wiring material layer is increased, and the third protective metal layer 240 can be prevented from forming a tip structure, and the shape of the metal wiring layer 200 can be improved.

According to some embodiments, as shown in FIGS. 3 and 11, before step S130, the manufacturing method of the array substrate may further include: forming a first passivation layer 310 on a side of the metal wiring layer 200 away from the base substrate 100. The material of the passivation layer 310 may be silicon nitride, silicon oxide, silicon oxynitride or other inorganic insulating materials to protect the sidewall of the metal wiring layer 200 from oxidation.

In step S130, as shown in FIGS. 3 and 11, the planarization layer 320 may be formed on a side of the metal wiring layer 200 away from the base substrate 100. The planarization layer 320 is used to provide a planarized surface for the drive lead layer 400. A via hole may be provided in the planarization layer 320, so that the drive lead layer 400 is electrically connected to the metal wiring layer 200 through the via hole. In some embodiments, when the functional device layer 510 is electrically connected to the metal wiring layer 200, the functional device 511 may be electrically connected to the metal wiring layer 200 through the via hole. In other embodiments, a drive chip 521, a circuit board, etc. may also be electrically connected to the metal wiring layer 200 through vias.

In step S140, as shown in FIGS. 4 and 14, the drive lead layer 400 may be formed on a side of the planarization layer 320 away from the base substrate 100. From the perspective of distinguishing patterns belonging to the same film or layer according to their specific positions and/or functions, the drive lead layer 400 may include one or more drive leads 720, and these drive leads 720 may directly or indirectly provide drive signals to the functional device 511, such as providing drive current or drive voltage. Since the drive lead layer 400 includes the second copper metal layer 401 with a relatively large thickness, the drive lead layer 400 has low impedance and can meet the electrical requirements of the array substrate.

In some embodiments, in step S140, from the perspective of the in-layer structure, a seed metal layer 410 may be formed on a side of the planarization layer 320 away from the base substrate 100. Then, a copper growth layer 420 is formed on the seed metal layer 410, so as to form the drive lead layer 400.

According to some embodiments, from the perspective of the in-layer structure, a seed metal material layer can be formed on the side of the planarization layer 320 away from the base substrate 100 first, and then the seed metal material layer can be patterned to form the seed metal layer 410. According to an exemplary embodiment, a photolithography process can be used to pattern the seed metal material layer.

According to some embodiments, as shown in FIG. 4 and FIG. 14, from the perspective of the in-layer structure, the seed metal layer 410 may include a copper seed layer 412. Exemplarily, the thickness of the copper seed layer 412 may be 2000-6000 angstroms. From the perspective of the in-layer structure, the second copper metal layer 401 includes a copper seed layer 412 and a copper growth layer 420 which are stacked.

According to some embodiments, as shown in FIGS. 4 and 14, from the perspective of the in-layer structure, the seed metal layer 410 may also include a fourth protective metal layer 411 located on a surface of the copper seed layer 412 close to the base substrate 100. The material of the fourth protective metal layer 411 may be selected from molybdenum, molybdenum-copper alloy, molybdenum-niobium alloy, molybdenum-copper-niobium alloy, or other metals or metal alloys. The fourth protective metal layer 411 may increase the adhesion between the copper seed layer 412 and the metal wiring layer 200. According to an exemplary embodiment, the material of the fourth protective metal layer 411 is the molybdenum-niobium alloy. The thickness of the fourth protective metal layer 411 may be 200-500 angstroms.

In an embodiment of the present disclosure, from the perspective of the in-layer structure, a fourth protective metal material layer and a copper seed material layer can be sputtered in sequence on a side of the planarization layer 320 away from the base substrate 100. The fourth protective metal material layer and the copper seed material layer constitute the seed metal material layer in this embodiment. Then, the seed metal material layer is patterned by a photolithography process to form the seed metal layer 410.

According to some embodiments, from the perspective of the in-layer structure, the copper growth layer 420 may be formed by copper electroplating or electroless copper plating. The thickness of the copper growth layer 420 can be determined according to the electrical requirements of the array substrate, to make the thickness of the copper growth layer 420 can fully meet the current load requirement and voltage drop requirement of the array substrate. According to some embodiments, the thickness of the copper growth layer 420 can be controlled so that the thickness of the second copper metal layer 401 is greater than the thickness of the first copper metal layer 220. Further, the thickness of the second copper metal layer 401 can be made not less than twice the thickness of the first copper metal layer 220. According to an exemplary embodiment, the thickness of the second copper metal layer 401 can be made not less than 3.5 times of the thickness of the first copper metal layer 220, to ensure that the second copper metal layer 401 has a low impedance.

According to some embodiments, the thickness of the copper growth layer 420 may be 1.0-20 micrometers to ensure that the drive lead layer 400 has a low impedance. According to an exemplary embodiment, the thickness of the copper growth layer 420 may be 2-5 micrometers. According to an exemplary embodiment, the thickness of the copper growth layer 420 is 2.1 micrometers.

As shown in FIGS. 4 and 14, from the perspective of the in-layer structure, a fifth protective metal layer 430 may be grown on a side of the copper growth layer 420 away from the base substrate 100. The material of the fifth protective metal layer 430 may be the copper-nickel alloy or the nickel metal to prevent the copper growth layer 420 from being oxidized. When the functional device layer 510 is electrically connected to the drive lead layer 400, the fifth protective metal layer 430 can increase the adhesion between the functional device 511 and the drive lead layer 400, especially increase the adhesion between the connection structure 620 and the drive lead layer 400. According to an exemplary embodiment, when the copper growth layer 420 is formed by electroplating, the fifth protective metal layer 430 can be formed by electroplating; when the copper growth layer 420 is formed by electroless plating, the fifth protective metal layer 430 can be formed by electroless plating.

According to some embodiments, the thickness of the fifth protective metal layer 430 may be 400-2000 angstroms. According to an exemplary embodiment, the thickness of the fifth protective metal layer 430 is 500 angstroms. When the material of the fifth protective metal layer 430 is the copper-nickel alloy, the weight content of nickel in the copper-nickel alloy is not less than 5%; preferably, the weight content of nickel in the copper-nickel alloy is not less than 20%. In this way, it can be ensured that the fifth protective metal layer 430 has a good anti-oxidation effect.

In an embodiment of the present disclosure, from the perspective of the in-layer structure, a copper electroplating method can be used to form the copper growth layer 420 on the side of the seed metal layer 410 away from the base substrate 100. Then, the copper-nickel alloy is electroplated to form the fifth protective metal layer 430 on the side of the copper growth layer 420 away from the base substrate 100.

In another embodiment of the present disclosure, from the perspective of the in-layer structure, an electroless copper plating method can be used to form the copper growth layer 420 on the side of the seed metal layer 410 away from the base substrate 100. Then, the copper-nickel alloy is electroless plated to form the fifth protective metal layer 430 on the side of the copper growth layer 420 away from the base substrate 100.

In an embodiment of the present disclosure, as shown in FIG. 4 and FIG. 14, from the perspective of the in-layer structure, the drive lead layer 400 includes the fourth protective metal layer 411, the copper seed layer 412, the copper growth layer 420 and the fifth protective metal layer 430 which are sequentially stacked on a side of the planarization layer 320 away from the base substrate 100. The fourth protective metal layer 411 and the copper seed layer 412 constitute the seed metal layer 410 of the drive lead layer 400. The copper growth layer 420 and the copper seed layer 412 constitute the second copper metal layer 401 of the drive lead layer 400.

In step S150, as shown in FIGS. 6 and 16, a functional device layer 510 is provided on a side of the drive lead layer 400 away from the base substrate 100, and the functional device layer 510 is electrically connected to the metal wiring layer 200 or the drive lead layer 400. In the following descriptions, patterns in the functional layer 510 will be described according to their positions and/or functions. One of the metal wiring layer 200 or the drive lead layer 400 is provided with one or more device pads 730, and the functional device layer 510 includes an array of functional devices 511. The functional devices 511 may be electrically connected to the device pads 730. In other words, from a top view, a partial area of the metal wiring layer 200 can be used as a device pad 730 to be electrically connected to a functional device 511, or a partial area of the drive lead layer 400 can be used as a device pad 730 to be electrically connected to a functional device 511. In an embodiment of the present disclosure, a functional device 511 has a cathode and an anode, and the cathode and anode of the functional device 511 are electrically connected to two device pads 730 respectively.

The functional devices 511 may include light emitting devices for emitting light, ultrasonic emitting devices for emitting ultrasonic waves, heating devices for generating heat, or other current-driven functional devices 511.

According to some embodiments, the functional devices 511 may be micro light emitting diodes (Micro LEDs) or mini light emitting diodes (Mini LEDs). Accordingly, the array substrate can be used as a display panel for displaying images, or can be used as a backlight source of a backlight module.

According to some embodiments, the functional device layer 510 may be disposed on a side of the device pads 730 away from the base substrate 100 through a mass transfer technology and a bonding process. Further, the functional devices 511 can be electrically connected to the device pads 730 through connection structures 620. The connection structures 620 can be formed by solder paste, conductive glue or other materials, or the connection structures 620 can be a structure with convex and concave portions shaped like spines formed by hard metals. Exemplarily, the functional devices 511 can be connected to the device pads 730 through connection structures formed by the solder paste through processes such as printing soldering, die bonding, and reflow soldering.

In the manufacturing method of the array substrate according to embodiments of the present disclosure, a mask for patterning can be used in each of the three steps of forming the metal wiring layer 200, forming the planarization layer 320, and forming the drive lead layer 400, which can reduce the number of masks used in the manufacturing processes of the substrate, reduce the number of the preparation processes, and thereby increase the production of the array substrate and reduce the costs of the array substrate.

Figure 5:
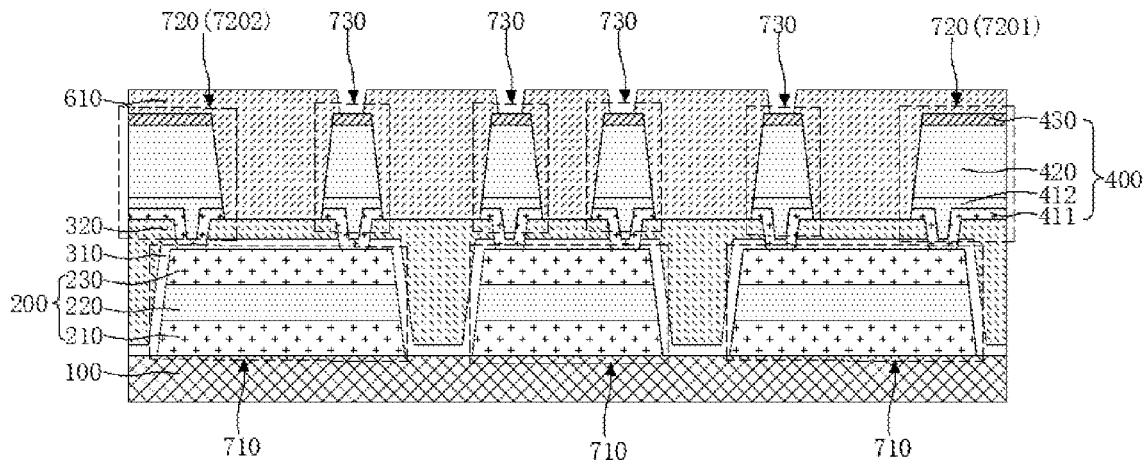
FIG. 5 is a schematic structural diagram showing forming of a protective layer according to an embodiment of the present disclosure.
Figure 15:
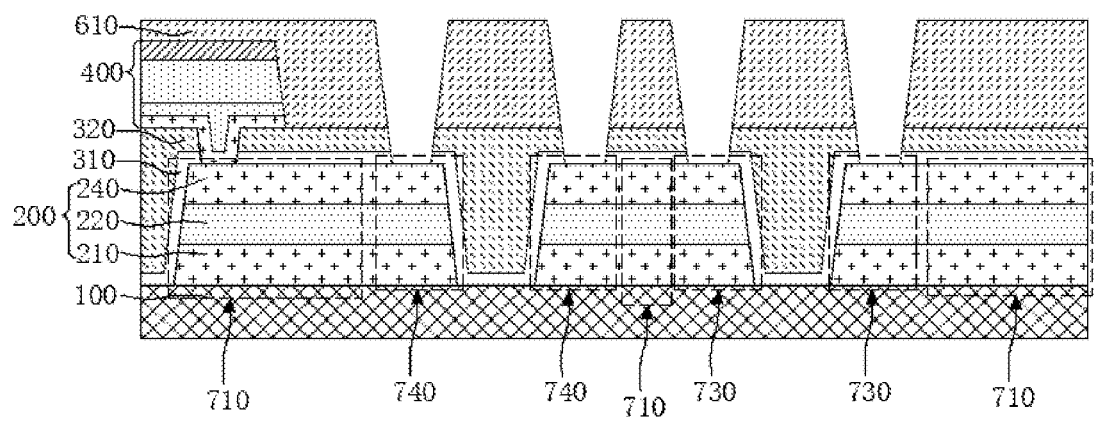
FIG. 15 is a schematic structural diagram showing forming of a protective layer according to an embodiment of the present disclosure.

According to some embodiments, before step S150, as shown in FIGS. 5 and 15, the manufacturing method of the array substrate may further include: forming a protective layer 610 on a side of the drive lead layer 400 away from the base substrate 100. The protective layer 610 may expose at least part of the areas of the device pads 730 so that the functional devices 511 are electrically connected to the device pads 730. The functional device layer 510 is formed on a side of the protective layer 610 away from the base substrate 100.

According to an exemplary embodiment, the protective layer 610 may be formed by screen printing white oil. The white oil includes a photocurable matrix and titanium dioxide dispersed in the photocurable matrix. Further, the photocurable matrix may include acrylic monomers.

In some embodiments, before the protective layer 610 is formed, a planarization organic layer may be formed on a side of the drive lead layer 400 away from the base substrate 100. The protective layer 610 may be formed on a side of the planarization organic layer away from the base substrate 100. The planarization organic layer may expose at least a part of the area of each device pad 730 so that the functional devices 511 and the device pads 730 are electrically connected. In an embodiment of the present disclosure, a planarization organic photosensitive material layer may be formed on the side of the drive lead layer 400 away from the base substrate 100, and then the planarization organic photosensitive material layer may be patterned to form the planarization organic layer.

In some embodiments, after the drive lead layer 400 is formed, a second passivation layer may be formed on a surface of the drive lead layer 400 away from the base substrate 100. The planarization organic layer may be formed on a side of the second passivation layer away from the base substrate 100. The material of the second passivation layer can be selected from silicon nitride, silicon oxide, silicon oxynitride or other inorganic insulating materials to protect the drive lead layer 400 from corrosion or oxidation during subsequent manufacturing processes. According to some embodiments, the second passivation layer may expose at least part of the area of each device pad 730, so that the functional devices 511 are electrically connected to the device pads 730.

According to some embodiments, when the drive lead layer 400 has the fifth protective layer 610, the array substrate may not be provided with the second passivation layer and the planarization organic layer, so as to reduce the number of manufacturing processes of the array substrate and increase the yield of the array substrate. Further, omission of the second passivation layer can avoid blistering defects of the planarization layer 320 which may be generated because the planarization layer 320 is covered during the baking process.

In the manufacturing method of the array substrate according to embodiments the present disclosure, the metal wiring layer 200, the planarization layer 320, and the drive lead layer 400 that are sequentially stacked may be formed in step S120 to step S140. Patterns belonging to the same film or layer will be described below depending on their specific positions and/or functions. The metal wiring layer 200 and the drive lead layer 400 may at least include conductive structures such as the drive leads 720, connection leads 710, and device pads 730. The surface of each device pad 730 away from the base substrate is at least partially exposed for connection with pins of a functional device 511, and the pins may be located at the drive lead layer 400 or the metal wiring layer 200. The connection leads 710 are located at the metal wiring layer 200 and are used to connect the device pads 730. The drive leads 720 are located at the drive lead layer 400 and are used to load drive signals to the connection leads 710 and to the device pads 730 through the connection leads 710. The drive leads 720 are used to transmit the drive signals through layers on the substrate, and the transmission path of the drive signals is long. The second copper metal layer 401 with a large thickness can reduce the voltage drop and power consumption generated by such long transmission path. The connection leads 710 transmit the drive signals to the device pads 730 at local positions, and the transmission path is short, the voltage drop is small, and the power consumption is low. Therefore, even a thin thickness of the connection leads will not affect the electrical performance of the array substrate.

According to an exemplary embodiment, the drive leads 720 are used to load power signals, for example, to load two different voltage signals, so as to drive the functional devices 511. Exemplarily, the drive leads 720 include a first drive lead 7201 for loading an anode voltage signal and a second drive lead 7202 for loading a cathode voltage signal. In an embodiment of the present disclosure, the cathode voltage signal may be a ground signal.

Patterns belonging to the same film or layer will be respectively described depending on their specific positions and/or functions. One of the metal wiring layer 200 and the drive lead layer 400 may further include circuit board pads, and the circuit board pads may be provided at the metal wiring layer 200 or the drive lead layer 400 and used for electrical connection with a circuit board for driving the array substrate. The circuit board loads drive signals to the drive leads 720 through the circuit board pads. In an embodiment of the present disclosure, the circuit board pads and the device pads 730 are arranged in the same layer, for example, the circuit board pads and the device pads 730 are both arranged at the drive lead layer 400 or both are arranged at the metal wiring layer 200.

According to some embodiments, when the circuit board pads are located at the metal wiring layer 200, the circuit board pads are electrically connected to the drive leads 720 through the connection leads 710; when the circuit board pads are located at the drive lead layer 400, the circuit board pads are electrically connected to the drive leads 720 through the connection leads, or directly electrically connected to the drive leads 720.

According to some embodiments, the circuit board may be a flexible circuit board.

According to some embodiments, drive chips may be provided on the circuit board to drive the functional devices 511 of the array substrate.

In some embodiments, from the perspective of distinguishing patterns belonging to the same film or layer according to their specific positions and/or functions, one of the metal wiring layer 200 and the drive lead layer 400 may further include one or more chip pads 740. The manufacturing method of the array substrate may include: providing a drive chip layer 520. The drive chip layer 520 includes a plurality of drive chips 521, and the drive chips 521 are electrically connected to the chip pads 740. The drive chips 521 may be connected to the device pads 730 and the drive leads 720 through the connection leads 710, so as to drive the functional devices 511 according to the signals on the drive leads 720. According to an exemplary embodiment, from the perspective of distinguishing patterns belonging to the same film or layer according to their specific positions and/or functions, one of the metal wiring layer 200 and the drive lead layer 400 may further include control leads, which are electrically connected to the drive chips 521 so as to control the drive chips 521. In an embodiment of the present disclosure, the chip pads 740 and the device pads 730 are provided on the same layer, for example, the chip pads 740 and the device pads 730 are both provided at the drive lead layer 400 or both are provided at the metal wiring layer 200. In an embodiment of the present disclosure, the control leads can be used as the connection leads 710 and arranged at the metal wiring layer 200. The control leads are only used to provide the control signals to the drive chips 521, the loads of the control leads are small, and even if the control leads are arranged at the metal wiring layer 200, there will be no a significant increase in power consumption or significant distortion of the control signals.

According to some embodiments, when the chip pads 740 are located at the metal wiring layer 200, the chip pads 740 are electrically connected to the drive leads 720 through the connection leads 710; when the chip pads 740 are located at the drive lead layer 400, the chip pads 740 are electrically connected to the drive leads 720 through the connection leads 710, or directly electrically connected to the drive leads 720.

In some embodiments, from the perspective of distinguishing patterns belonging to the same film or layer according to their specific positions and/or functions, the array substrate is provided with chip pads 740 in the drive lead layer 400 or the metal wiring layer 200. The manufacturing method may further include: after the drive lead layer 400 is formed, providing a drive chip layer 520 on a side of the drive lead layer 400 away from the base substrate 100. The drive chip layer 520 includes a plurality of drive chips 521 connected to the chip pads 740. According to an exemplary embodiment, after the protective layer 610 is formed, the drive chip layer 520 is provided on a side of the protective layer 610 away from the base substrate 100.

In an embodiment of the present disclosure, in step S120, as shown in FIG. 2, the metal wiring layer 200 may be formed on a side of the base substrate 100, and the metal wiring layer 200 includes connection leads 710. In step S140, as shown in FIG. 4, the drive lead layer 400 may be formed on a side of the planarization layer 320 away from the base substrate 100. The drive lead layer 400 includes drive leads 720 and device pads 730, and both of the drive leads 720 and the device pads 730 are electrically connected to the connection leads 710. In the array substrate according to embodiments of the present disclosure, from the perspective of distinguishing patterns belonging to the same film or layer according to their specific positions and/or functions, the metal wiring layer 200 includes connection leads 710, and the drive lead layer 400 includes drive leads 720 and device pads 730; the functional devices 511 of the functional device layer 510 are electrically connected to the drive lead layer 400.

Further, in step S130, as shown in FIG. 3, the planarization layer 320 may be formed on a side of the metal wiring layer 200 away from the base substrate 100. The planarization layer 320 has one or more first via holes 301 and one or more second via holes 302 exposing the connection leads 710. In step S140, as shown in FIG. 4, the seed metal layer 410 may be formed on a side of the planarization layer 320 away from the base substrate 100. From the perspective of distinguishing patterns belonging to the same film or layer according to their specific positions and/or functions, the seed metal layer 410 includes a device pad seed layer 731 and a drive lead seed layer 721. The device pad seed layer 731 is electrically connected to the connection leads 710 through the second via holes 302, and the drive lead seed layer 721 is connected to the connection leads 710 through the first via holes 301. Using an electroless copper plating method, the copper growth layer 420 is formed on a side of the seed metal layer 410 away from the base substrate 100. From the perspective of distinguishing patterns belonging to the same film or layer according to their specific positions and/or functions, the copper growth layer 420 includes a device pad growth layer 732 on a surface of the device pad seed layer 731 away from the base substrate 100 and a drive lead growth layer 722 on a surface of the drive lead seed layer 721 away from the base substrate 100.

In the manufactured array substrate, the planarization layer 320 includes one or more first via holes 301 and one or more second via holes 302. The device pads 730 are electrically connected to the connection leads 710 through the second via holes 302, and the drive leads 720 are electrically connected to the connection leads 710 through the first via holes 301. Each of the device pads 730 include the device pad seed layer 731 and the device pad growth layer 732 that are stacked; each of the drive leads 720 includes the drive lead seed layer 721 and the drive lead growth layer 722 that are stacked.

Furthermore, in step S140, after the copper growth layer 420 is formed, a fifth protective metal layer 430 may be formed by electroless plating. The fifth protective metal layer 430 includes a device pad protective layer on a surface of the device pad growth layer 732 away from the base substrate 100 and a drive lead protective layer on a surface of the drive lead growth layer 722 away from the base substrate 100. In the array substrate according to the embodiment, from the perspective of the in-layer structure, each of the device pads 730 includes the device pad seed layer 731, the device pad growth layer 732, and the device pad protective layer that are stacked. From the perspective of the internal structure, each of the drive leads 720 includes the drive lead seed layer 721, the drive lead growth layer 722, and the drive lead protective layer that are stacked.

According to some embodiments, in step S140, when the drive leads 720 and the device pads 730 are formed, the circuit board pads may also be formed. In the manufactured array substrate, from the perspective of distinguishing patterns belonging to the same film or layer according to their specific positions and/or functions, the drive lead layer 400 includes the drive leads 720, the device pads 730, and the circuit board pads.

According to some embodiments, chip pads 740 may also be formed in step S140. In the manufactured array substrate, from the perspective of distinguishing patterns belonging to the same film or layer according to their specific positions and/or functions, the drive lead layer 400 includes drive leads 720, device pads 730, circuit board pads, and chip pads 740.

In another embodiment of the present disclosure, in step S120, as shown in FIG. 10, the metal wiring layer 200 may be formed on a side of the base substrate 100. From the perspective of distinguishing patterns belonging to the same film or layer according to their specific positions and/or functions, the metal wiring layer 200 includes the connection leads 710 and the device pads 730 electrically connected to the connection leads 710. In step S140, as shown in FIG. 14, the drive lead layer 400 may be formed on the side of the planarization layer 320 away from the base substrate 100. From the perspective of distinguishing patterns belonging to the same film or layer according to their specific positions and/or functions, the drive lead layer 400 includes the drive leads 720 electrically connected to the connection leads 710. In the manufactured array substrate according to the embodiment, the metal wiring layer 200 includes the connection leads 710 and the device pads 730; the drive lead layer 400 includes the drive leads 720.

Further, in step S140, as shown in FIG. 13, the seed metal layer 410 may be formed on the side of the planarization layer 320 away from the base substrate 100. From the perspective of distinguishing patterns belonging to the same film or layer according to their specific positions and/or functions, the seed metal layer 410 includes the drive lead seed layer 721. As shown in FIG. 14, the copper electroplating method is used to form the copper growth layer 420 on the side of the seed metal layer 410 away from the base substrate 100. From the perspective of distinguishing patterns belonging to the same film or layer according to their specific positions and/or functions, the copper growth layer 420 includes the drive lead growth layer located on a surface of the drive lead seed layer 721 away from the base substrate 100. From the perspective of the in-layer structure, each of the drive leads 720 includes the drive lead seed layer 721 and the drive lead growth layer 722 that are stacked.

Furthermore, in step S140, as shown in FIG. 14, after the copper growth layer 420 is formed, a fifth protective metal layer 430 may be formed by electroplating. The fifth protective metal layer 430 includes a drive lead protective layer formed on a surface of the drive lead growth layer away from the base substrate 100. In the manufactured array substrate according to the embodiment, from the perspective of the in-layer structure, each of the drive leads 720 includes the drive lead seed layer 721, the drive lead growth layer, and the drive lead protective layer that are stacked.

Figure 12:
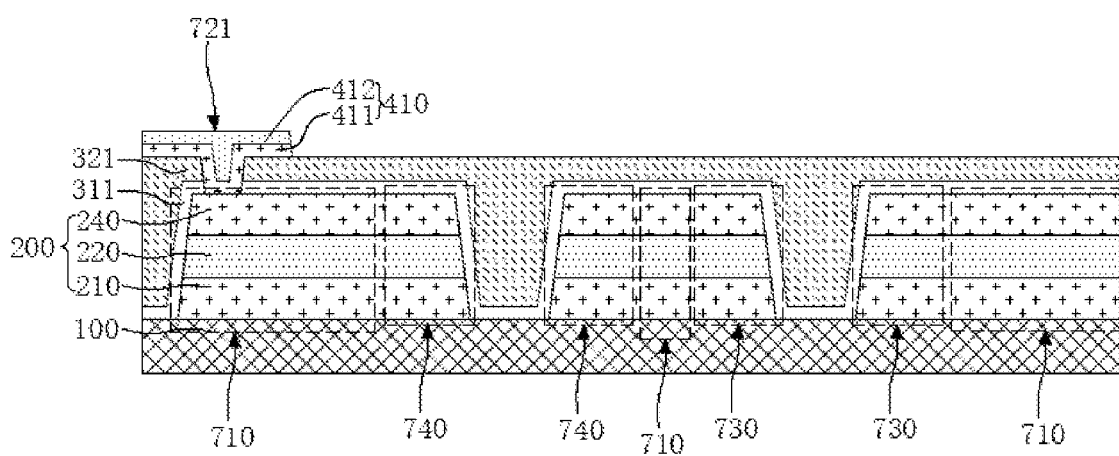
FIG. 12 is a schematic structural diagram showing forming of a seed metal layer according to an embodiment of the present disclosure.

According to some embodiments, in step S130, as shown in FIG. 11, a planarization precursor layer 321 may be formed on the side of the metal wiring layer 200 away from the base substrate 100 first, and the planarization precursor layer 321 has one or more third via holes 303 that expose the connection leads 710. The via holes 303 are used to enable the seed metal layer 410 to be electrically connected to the connection leads 710 through the third via holes 303. As shown in FIG. 12, when the seed metal layer 410 is formed, the seed metal layer 410 is electrically connected to the connection leads 710 through the third via holes 303. The drive lead layer 400 is only provided with the drive leads 720, or is also provided with other possible conductive structures directly connected to the drive leads 720, it can be ensured that an electroplating voltage is applied to each position of the seed metal layer 410 during the electroplating process to ensure that the copper growth layer 420 laminated on the seed metal layer 410 is formed.

After the seed metal layer 410 is formed, as shown in FIG. 13, one or more fourth via holes 304 are formed on the planarization precursor layer 321, and the fourth via holes 304 expose the device pads 730. The planarization precursor layer 321 is patterned into the planarization layer 320 such that the planarization layer 320 includes the fifth via holes 305 and the fourth via holes 304. The fourth via holes 304 expose the device pads 730 so that the device pads 730 are connected to the functional devices 511. Since the fourth via holes 304 are formed after the seed metal layer 410 is formed, the seed metal layer 410 does not cover the device pads 730, and thus the device pads 730 will not deposit the copper growth layer 420 during the electroplating process.

In the embodiment, although the preparation of the planarization layer 320 is completed by two patterning operations, the method can use the electroplating method to form the copper growth layer 420, and the growth rate of the copper growth layer 420 is greater than the growth rate of copper in electroless plating. Therefore, the yield of the array substrate can be increased, and the cost of the array substrate can be reduced.

According to some embodiments, in step S120, as shown in FIG. 10, the metal wiring layer 200 may be formed on a side of the base substrate 100. The metal wiring layer 200 includes the first copper metal layer 220 and a protective metal layer on a surface of the first copper metal layer 220 away from the base substrate 100. For example, a third protective metal layer 240 is formed. In this way, the surfaces of the device pads 730 are made of the copper-nickel alloy, which can further suppress the deposition of copper during the electroplating process.

According to an exemplary embodiment, after forming the seed metal layer 410 and before forming the copper growth layer 420, the fourth via holes 304 are formed on the planarization precursor layer 321. Before the formation of the copper growth layer 420, high-generation equipment can be used to produce the array substrate, for example, the array substrate can be produced by higher generation equipment that the sixth generation equipment, so as to increase the yield of the array substrate and reduce the cost of the array substrate. After the fourth via holes 304 are formed, the high-generation backplane can be cut into multiple low-generation backplanes, and then the middle and low-generation equipment is used for subsequent production, for example, the fifth to sixth generation equipment is used for subsequent production, so as to overcome the deficiency that it is difficult to perform electroplating or electroless plating in high-generation equipment. In this exemplary embodiment, as many steps and film structures as possible can be performed or completed in the high-generation equipment, which can significantly reduce the manufacturing cost of the array substrate.

In related arts, there are huge difficulties in electroplating or electroless plating of high-generation backplanes, such as difficulty in grasping the backplanes and difficulty in loading. Therefore, according to the related arts, it is difficult to prepare an array substrate containing thick copper on the high-generation equipment, which limits yield of the array substrate and results in a higher cost of the array substrate. In the manufacturing method of the array substrate according to some embodiments of the present disclosure, when manufacturing the metal wiring layer 200, the planarization layer 320 and other film layers, there is no need to use the electroplating process or the electroless plating process. Therefore, according to the manufacturing method of the array substrate according to some embodiments of the present disclosure, some of the steps in the early stage can be carried out in high-generation equipment using a large-sized backplane to increase the yield of the array substrate and reduce the cost; then, the large-sized backplane can be cut into multiple small-sized backplanes; later, in some of the steps in a later stage, especially from the steps that require electroplating or electroless plating processes, the small-sized backplanes can be processed in the equipment of a corresponding generation. In other words, the manufacturing method of the array substrate according to some embodiments of the present disclosure can enable part of the manufacturing processes of the array substrate to be carried out in high-generation equipment, for example, in equipment above 8.5G, so as to reduce the cost of the array substrate.

Figure 21:
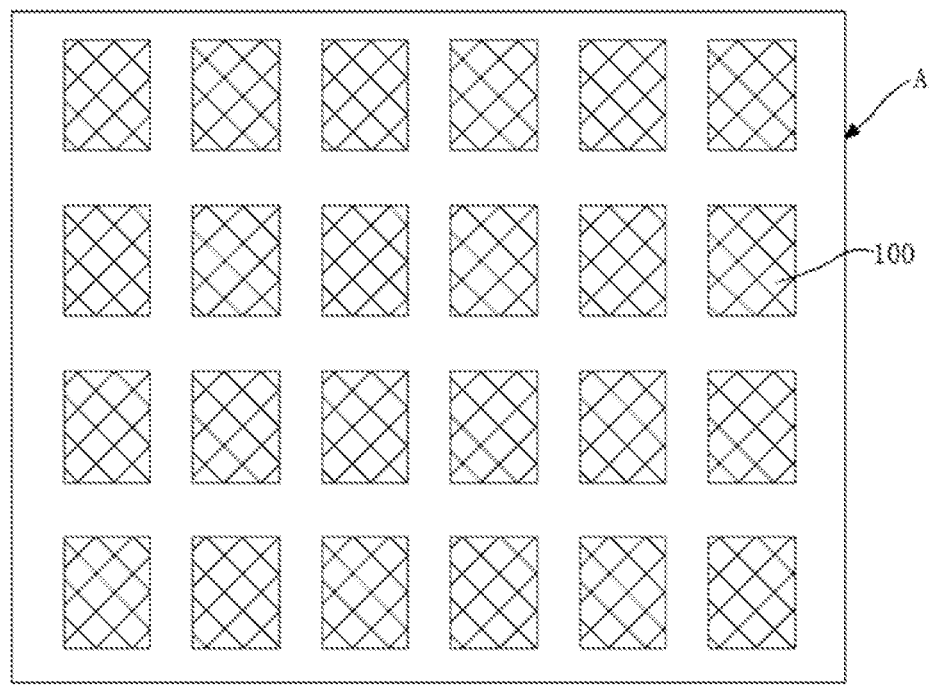
FIG. 21 is a schematic structural diagram of a first mother board substrate according to an embodiment of the present disclosure.

In some embodiments, in step S110, as shown in FIG. 21, a first mother board substrate A may be provided. The first mother board substrate A includes base substrates 100 of a plurality of array substrates. According to an exemplary embodiment, the first mother board substrate A may be a backplane suitable for 8.5 generation equipment or higher generation equipment. The larger the size of the first mother board substrate A is, the more the number of array substrates that can be finally cut out, the greater the yield of the array substrate, and the lower the manufacturing cost of the array substrate.

In step S120, the metal wiring layer 200 of each array substrate may be formed on a side of the first mother board substrate A.

In step S130, the planarization layer 320 of each array substrate may be formed on a side of each metal wiring layer 200 of the first mother board substrate A away from the base substrate 100.

Figure 22:
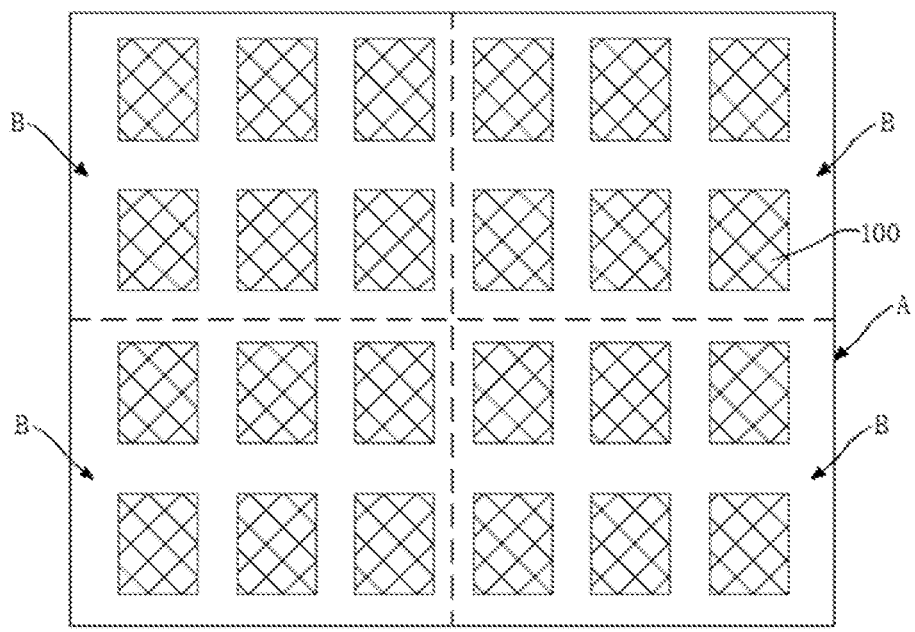
FIG. 22 is a schematic structural diagram showing dividing of a first mother board substrate into a plurality of second mother board substrates according to an embodiment of the present disclosure.

In step S140, the seed metal layer 410 of each array substrate may be formed on the side of each planarization layer 320 away from the base substrate 100. As shown in FIG. 22, after the seed metal layer 410 is formed, the first mother board substrate A is divided into a plurality of second mother board substrates B, and any one of the second mother board substrates B includes the base substrate 100 of at least one array substrate. In this way, the large-sized first mother board substrate A can be cut into smaller-sized second mother board substrates B, so as to address the problem that the first mother board substrate A is too large to be electroplated or electrolessly plated. For the second mother board substrates B after cutting, the copper growth layer 420 and/or the fifth protective metal layer 430 may be grown using electroplating equipment or electroless plating equipment. According to some embodiments, the second mother board substrates B may be suitable for the fifth generation electroplating equipment or the sixth generation electroplating equipment. According to some embodiments, the size of any two second mother board substrates B may be the same or different.

In step S140, the copper growth layer 420 of each array substrate is formed on the side of each seed metal layer 410 of each second mother board substrate B away from the base substrate 100.

In step S150, the functional device layer 510 of each array substrate may be provided on the side of each drive lead layer 400 of each second mother board substrate B away from the base substrate 100.

According to some embodiments, between step S140 and step S150, the second passivation layer of each array substrate may be formed on the side of each drive lead layer 400 of each second mother board substrate B away from the base substrate 100. Further, the planarization organic layer of each array substrate can also be formed on the side of each second passivation layer of each second mother board substrate B away from the base substrate 100.

According to some embodiments, between step S140 and step S150, the protective layer 610 of each array substrate may be formed on the side of each drive lead layer 400 of each second mother board substrate B away from the base substrate 100.

It should be noted that although various steps of the methods in the present disclosure are described in a specific order in the drawings, this does not require or imply that these steps must be performed in the specific order, or that all the steps shown must be performed to achieve the desired result. Additionally or alternatively, certain steps may be omitted, multiple steps may be combined into one step, and/or one step may be decomposed into multiple steps, etc., and all such modified embodiments should be regarded as part of the present disclosure.

An embodiment of the present disclosure also provides an array substrate, which includes:
- the base substrate 100;
- the metal wiring layer 200 provided on a side of the base substrate 100; the metal wiring layer 200 including the first copper metal layer 220;
- the planarization layer 320 provided on the side of the metal wiring layer 200 away from the base substrate 100;
- the drive lead layer 400 provided on the side of the planarization layer 320 away from the base substrate 100; and the drive lead layer 400 being electrically connected to the metal wiring layer 200; the drive lead layer 400 including the second copper metal layer 401, and the thickness of the second copper metal layer 401 being greater than the thickness of the first copper metal layer 220;
- the functional device layer 510 provided on the side of the drive lead layer 400 away from the base substrate 100, the functional device layer 510 being electrically connected to the metal wiring layer 200 or the drive lead layer 400.

The array substrate provided by embodiments of the present disclosure can be manufactured using the manufacturing methods described in the foregoing embodiments, and can therefore have the same or similar beneficial effects, which will not be repeated.

In an embodiment of the present disclosure, from the perspective of distinguishing patterns belonging to the same film or layer according to their specific positions and/or functions, the metal wiring layer 200 includes the connection leads 710 and the device pads 730 electrically connected to the connection leads 710; the drive lead layer 400 includes the drive leads 720 electrically connected to the connection leads 710.

In an embodiment of the present disclosure, from the perspective of distinguishing patterns belonging to the same film or layer according to their specific positions and/or functions, the metal wiring layer 200 includes the connection leads 710; the drive lead layer 400 includes the drive leads 720 and the device pads 730. Both the drive leads 720 and the device pads 730 are electrically connected to the connection leads 710.

In an embodiment of the present disclosure, the thickness of the second copper metal layer 401 is not less than twice the thickness of the first copper metal layer 220. According to an exemplary embodiment, the thickness of the second copper metal layer 401 is not less than 3.5 times the thickness of the first copper metal layer 220.

Other details of the array substrate have been described in the foregoing embodiments of the manufacturing method of the array substrate, or can be reasonably deduced based on the description of the foregoing embodiments, and repeated descriptions are omitted here.

In the following description, an array substrate and a manufacturing method of the array substrate are provided as examples in order to further explain and exemplify the principles and effects of the array substrate and the manufacturing method according to embodiments of the present disclosure.

In the exemplary array substrate, the functional devices 511 may be mini light emitting diodes (Mini LEDs). As shown in FIG. 6, the array substrate may include the base substrate 100, the metal wiring layer 200, the first passivation layer 310, the planarization layer 320, the drive lead layer 400, the protective layer 610, and the functional device layer 510 that are stacked in sequence.

Figure 8:
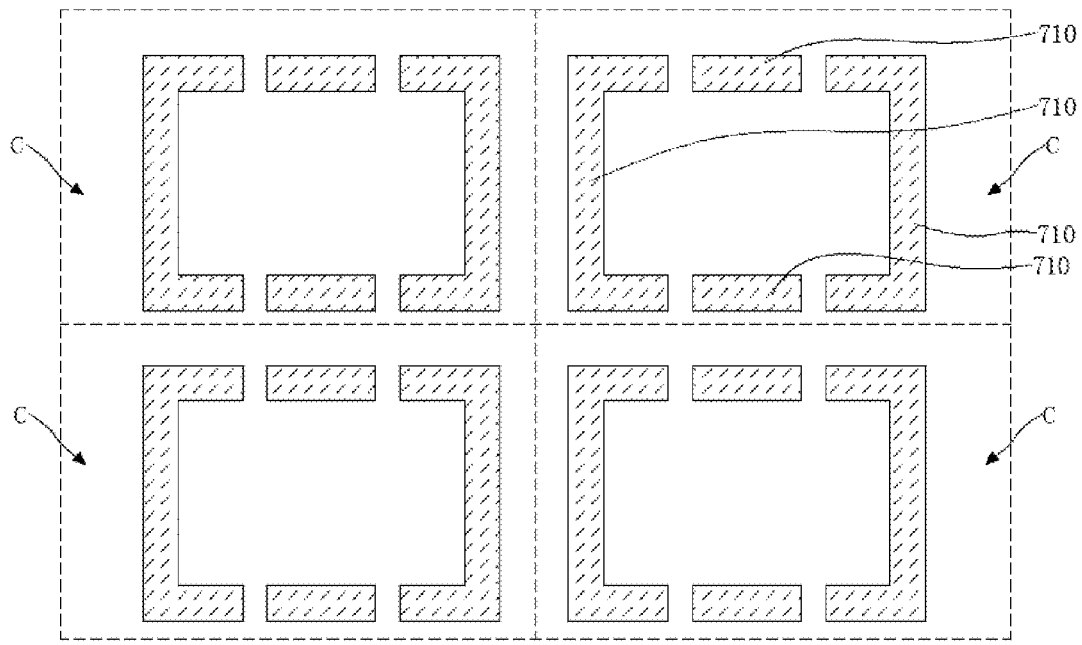
FIG. 8 is a schematic structural diagram of a metal wiring layer of an array substrate according to an embodiment of the present disclosure.
Figure 9:
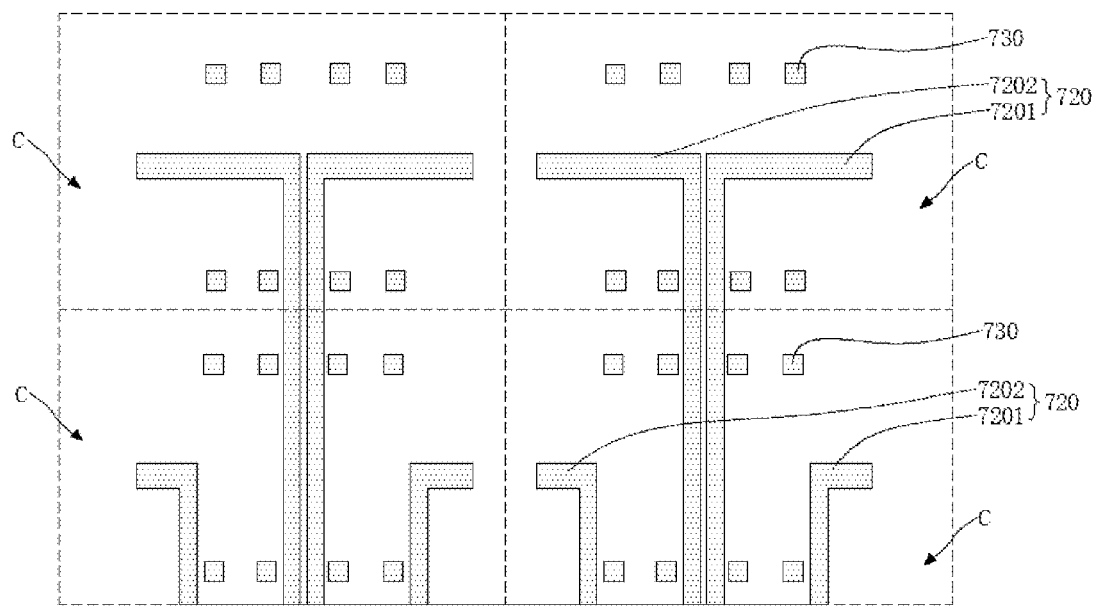
FIG. 9 is a schematic structural diagram of a drive lead layer of an array substrate according to an embodiment of the present disclosure.

In this exemplary array substrate, the material of the base substrate 100 is glass. From the perspective of the in-layer structure, the metal wiring layer 200 includes the first protective metal layer 210, the first copper metal layer 220, and the second protective metal layer 230 that are sequentially stacked on a side of the base substrate 100. The material of the first protective metal layer 210 and the second protective metal layer 230 is the molybdenum-niobium alloy, and their thickness is 300 angstroms. The material of the first copper metal layer 220 is copper metal, and the thickness is 6000 angstroms. As shown in FIG. 8, from the perspective of distinguishing patterns belonging to the same film or layer according to their specific positions and/or functions, the metal wiring layer 200 includes a plurality of connection leads 710. The material of the first passivation layer 310 is silicon nitride. As shown in FIG. 3, the planarization layer 320 and the first passivation layer 310 have the first via holes 301 and the second via holes 302, and both the first via holes 301 and the second via holes 302 expose at least part of the areas of the connection leads 710. As shown in FIG. 4, from the perspective of the in-layer structure, the drive lead layer 400 includes the fourth protective metal layer 411, the copper seed layer 412, the copper growth layer 420 and the fifth protective metal layer 430 which are sequentially stacked on a side of the planarization layer 320 away from the base substrate 100. The fourth protective metal layer 411 and the copper seed layer 412 constitute the seed metal layer 410 of the drive lead layer 400; the copper growth layer 420 and the copper seed layer 412 constitute the second copper layer 401 of the drive lead layer 400. The material of the fourth protective metal layer 411 is the molybdenum-niobium alloy with a thickness of 300 angstroms. The material of the fifth protective metal layer 430 is the copper-nickel alloy with a thickness of 500 angstroms. The thickness of the copper seed layer 412 is 3000 angstroms, and the thickness of the copper growth layer 420 is 2.1 micrometers. As shown in FIG. 9, from the perspective of distinguishing patterns belonging to the same film or layer according to their specific positions and/or functions, the drive lead layer 400 includes the drive leads 720 and the device pads 730. The drive leads 720 are electrically connected with the connection leads 710 by the first via holes 301, and the device pads 730 are electrically connected to the connection leads 710 through the second via holes 302. The material of the protective layer 610 is photocurable white oil, and the protective layer 610 has via holes exposing at least a part of each device pad 730. The functional device layer 510 has mini light emitting diodes distributed in an array, and the cathode and anode of each mini light emitting diode are electrically connected to the device pads 730 through the connection structures 620 respectively.

Figure 7:
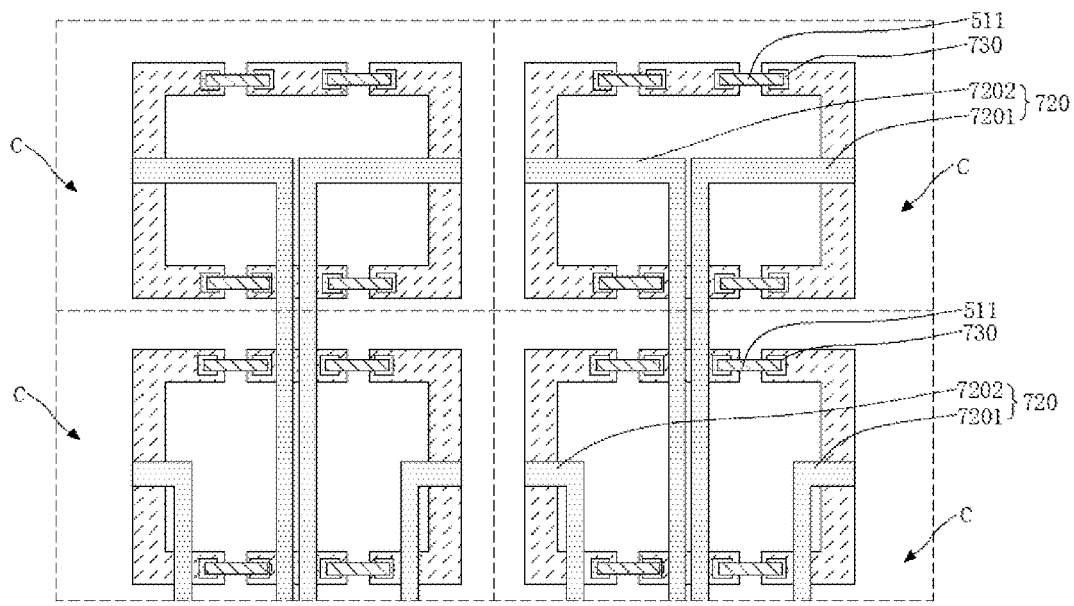
FIG. 7 is a schematic structural diagram showing a metal wiring layer, a drive lead layer, and a functional device layer of an array substrate according to an embodiment of the present disclosure.

In this exemplary array substrate, as shown in FIGS. 7-9, the array substrate includes a plurality of functional regions C distributed in an array. In any functional area C, the metal wiring layer 200 includes four connection leads 710 that are adjacent to each other in turn. The drive circuit layer includes eight device pads 730 electrically connected to the ends of connection leads 710 in a one-to-one correspondence. The functional device layer 510 includes four functional devices 511, so that two device pads 730 electrically connected to adjacent ends of two adjacent conductive leads are respectively connected to the anode and the cathode of a functional device 511. In the array substrate, the drive leads 720 include a first drive lead 7201 and a second drive lead 7202. The first drive lead 7201 is used to apply an anode drive voltage, and the second drive lead 7202 is used to apply a cathode drive voltage. Any one functional area C has a corresponding first drive lead 7201 and a corresponding second drive lead 7202, and the first drive lead 7201 and the second drive lead 7202 are respectively electrically connected to two non-adjacent connection leads 710 in the corresponding functional area C.

The exemplary array substrate can be manufactured by the G5~G6 production line using the following exemplary preparation methods:

In step S210, a molybdenum-niobium alloy material layer (corresponding to the first protective metal material layer with a thickness of 300 angstroms), a copper metal material layer (corresponding to the first copper metal material layer with a thickness of 6000 angstroms), and a molybdenum-niobium alloy material layer (corresponding to the second protective metal material layer with a thickness of 300 angstroms) are sequentially sputter deposited on a side of the base substrate 100, so as to form the metal wiring material layer. The metal wiring material layer is patterned to form the metal wiring layer 200.

In step S220, a silicon nitride layer is deposited by CVD (Chemical Vapor Deposition) on the side of the metal wiring layer 200 away from the base substrate 100, and then a photosensitive resin is coated to form a photosensitive resin layer. The photosensitive resin layer is exposed and developed to form the planarization layer 320. The exposed silicon nitride is etched, so that the silicon nitride layer is patterned into the first passivation layer 310. In this way, the first passivation layer 310 and the planarization layer 320 have the first via holes 301 and the second via holes 302.

In step S230, a molybdenum-niobium alloy layer (corresponding to the fourth protective metal material layer with a thickness of 300 angstroms) and a copper metal material layer (corresponding to the copper seed material layer with a thickness of 3000 angstroms) are sequentially sputtered on the side of the planarization layer 320 away from the base substrate 100, so as to form the seed metal material layer. Then, a patterning operation is performed on the seed metal material layer by a photolithography process to form the seed metal layer 410.

In step S240, using the electroless copper plating method, the copper metal is deposited on the side of the seed metal layer 410 away from the base substrate 100 to form the copper growth layer 420 with a thickness of 2.1 micrmeters. Then, by electroless plating of the copper-nickel alloy, the copper-nickel alloy is deposited on the side of the growth layer 420 away from the base substrate 100 to form the fifth protective metal layer 430 with a thickness of 0.05 μm.

In step S250, on the side of the fifth protective metal layer 430 away from the base substrate 100, white oil is screen-printed to form the protective layer 610.

In step S260, on the side of the protective layer 610 away from the base substrate 100, the mini light-emitting diodes are bonded through the connection structures 620.

This exemplary manufacturing method can complete the manufacturing of the array substrate using only three masks, which can greatly reduce the cost of the array substrate.

The exemplary array substrate can also be manufactured by the following exemplary preparation method:

In step S310, using the G10.5 (10.5 generation) production line, on the first motherboard substrate A including the base substrates 100 of a plurality of array substrates, the metal wiring layer 200, the first passivation layer 310, the planarization layer 320, and the seed metal layer 410 of each array substrate are sequentially formed according to step S210 to step S230.

In step S320, the first motherboard substrate A is cut into a plurality of second motherboard substrates B, so that the size of the second motherboard substrates B is reduced to be suitable for G5 to G6 production lines.

In step S330, using the G5~G6 (fifth to sixth generation) production lines, on each second motherboard substrate B, the copper growth layer 420, the fifth protective metal layer, the protective layer 610, and the functional device layer 510 are sequentially formed according to steps S240 to S260. In this way, a plurality of array substrates are obtained on the second motherboard substrates B. Each independent array substrate can be obtained by cutting.

In this exemplary preparation method, a part of the steps for manufacturing the array substrate can be carried on a high-generation production line, which can increase the yield of the array substrate and reduce the manufacturing cost.

In the following description, another array substrate and a manufacturing method of the array substrate are provided as examples in order to further explain and exemplify the principles and effects of the array substrate and the manufacturing method according to embodiments of the present disclosure.

In the exemplary array substrate, the functional devices 511 may be mini light emitting diodes (Mini LEDs). As shown in FIG. 16, the array substrate may include the base substrate 100, the metal wiring layer 200, the first passivation layer 310, the planarization layer 320, the drive lead layer 400, the protective layer 610, the functional device layer 510 and the drive chip layer 520 that are stacked in sequence. The drive chip layer 520 and the functional device layer 510 are provided on the same layer, i.e., both of the drive chip layer 520 and the functional device layer 510 are provided on a side of the protective layer 610 away from the base substrate 100.

Figure 18:
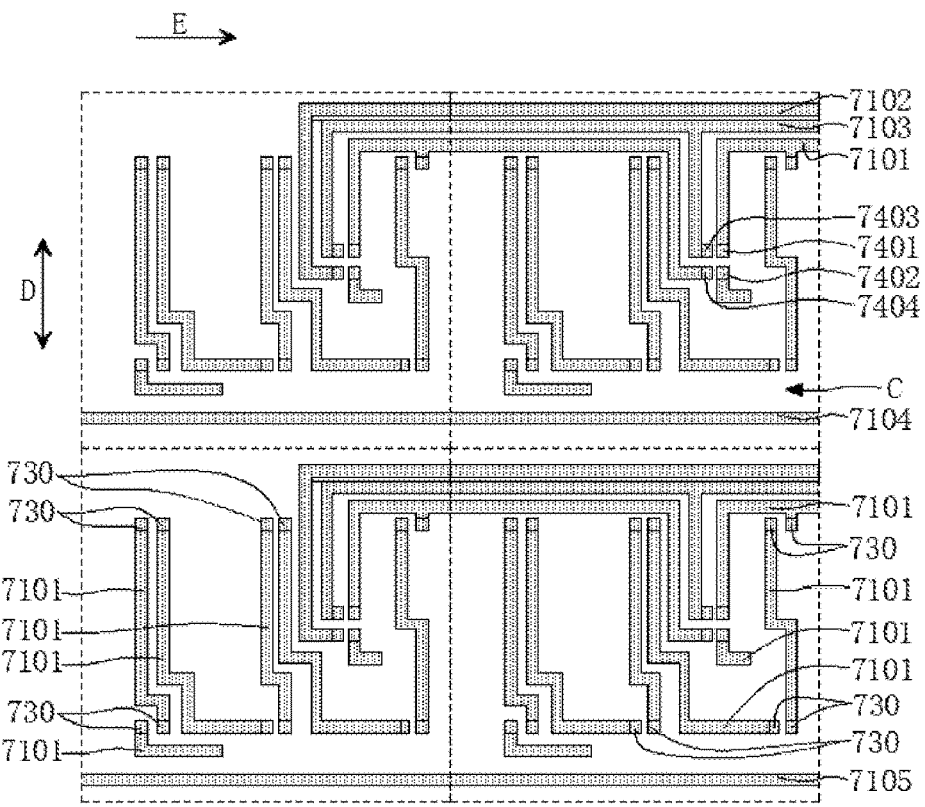
FIG. 18 is a schematic structural diagram a metal wiring layer of an array substrate according to an embodiment of the present disclosure.

In this exemplary array substrate, the material of the base substrate 100 is glass. As shown in FIG. 16, from the perspective of the in-layer structure, the metal wiring layer 200 includes the first protective metal layer 210, the first copper metal layer 220, and the third protective metal layer 240 that are sequentially stacked on a side of the base substrate 100. The material of the first protective metal layer 210 is the molybdenum-niobium alloy, and its thickness is 300 angstroms. The material of the first copper metal layer 220 is copper metal, and its thickness is 6000 angstroms. The material of the third protective metal layer 240 is the copper-nickel alloy, and its thickness is 500 angstroms. As shown in FIG. 16 and FIG. 18, from the perspective of distinguishing patterns belonging to the same film or layer according to their specific positions and/or functions, the metal wiring layer 200 includes a plurality of connection leads 710, a plurality of device pads 730 and a plurality of chip pads 740. The device pads 730 and the chip pads 740 are connected to the connection leads 710. The material of the first passivation layer 310 is silicon nitride. As shown in FIG. 14, the planarization layer 320 and the first passivation layer 310 have the third via holes 303, the fourth via holes 304 and the fifth via holes 305. The third via holes expose at least part of the areas of the connection leads 710. The fourth via holes 304 expose at least part of the areas of the device pads 730. The fifth via holes 305 expose at least part of the areas of the chip pads 740. From the perspective of the in-layer structure, the drive lead layer 400 includes the fourth protective metal layer 411, the copper seed layer 412, the copper growth layer 420 and the fifth protective metal layer 430 which are sequentially stacked on a side of the planarization layer 320 away from the base substrate 100. The fourth protective metal layer 411 and the copper seed layer 412 constitute the seed metal layer 410 of the drive lead layer 400; the copper growth layer 420 and the copper seed layer 412 constitute the second copper layer 401 of the drive lead layer 400. The material of the fourth protective metal layer 411 is the molybdenum-niobium alloy with a thickness of 300 angstroms. The material of the fifth protective metal layer 430 is the copper-nickel alloy with a thickness of 500 angstroms. The thickness of the copper seed layer 412 is 3000 angstroms. From the perspective of distinguishing patterns belonging to the same film or layer according to their specific positions and/or functions, the drive lead layer 400 includes the drive leads 720. The drive leads 720 are electrically connected with the connection leads 710 by the third via holes 303. The material of the protective layer 610 is photocurable white oil, and the protective layer 610 has via holes exposing at least a part of each device pad 730 and at least a part of each chip pad 740. The functional device layer 510 has mini light emitting diodes distributed in an array, and the cathode and anode of each mini light emitting diode are electrically connected to the device pads 730 through the connection structures 620 respectively. The drive chip layer 520 is provided with a plurality of drive chips 521 which are connected with the chip pads 740.

Figure 19:
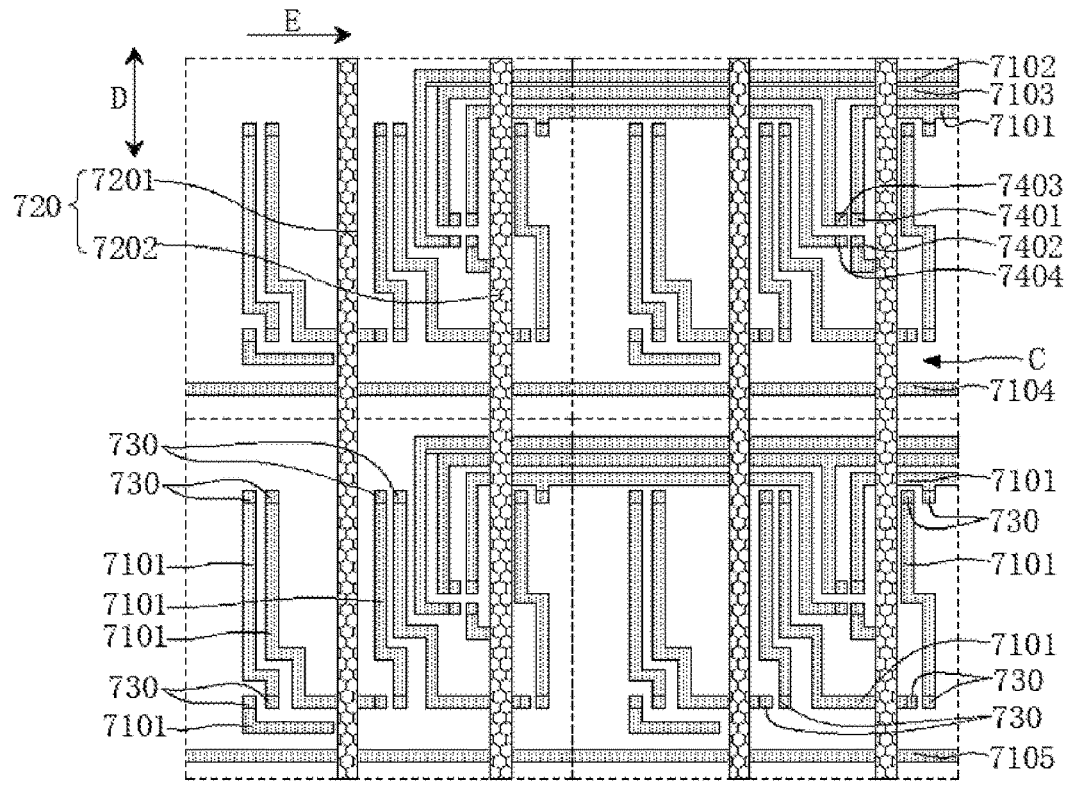
FIG. 19 is a schematic structural diagram a metal wiring layer and a drive lead layer of an array substrate according to an embodiment of the present disclosure.

In this exemplary array substrate, as shown in FIG. 18, the connection leads 710 may include a first connection lead 7101 to a fifth connection lead 7105. The chip pads 740 include a first chip pad 7401 to a fourth chip pad 7404. As shown in FIG. 19, the drive leads 720 include a first drive lead 7201 and a second drive lead 7202. The exemplary array substrate includes a plurality of functional regions C distributed in an array. The first drive lead 7201 and the second drive lead 7202 extend along a first direction D. The plurality of functional areas C are arranged in multiple functional area rows, and any one functional area row includes multiple functional areas C arranged in sequence along a second direction E. The first direction D and the second direction E intersect.

Figure 17:
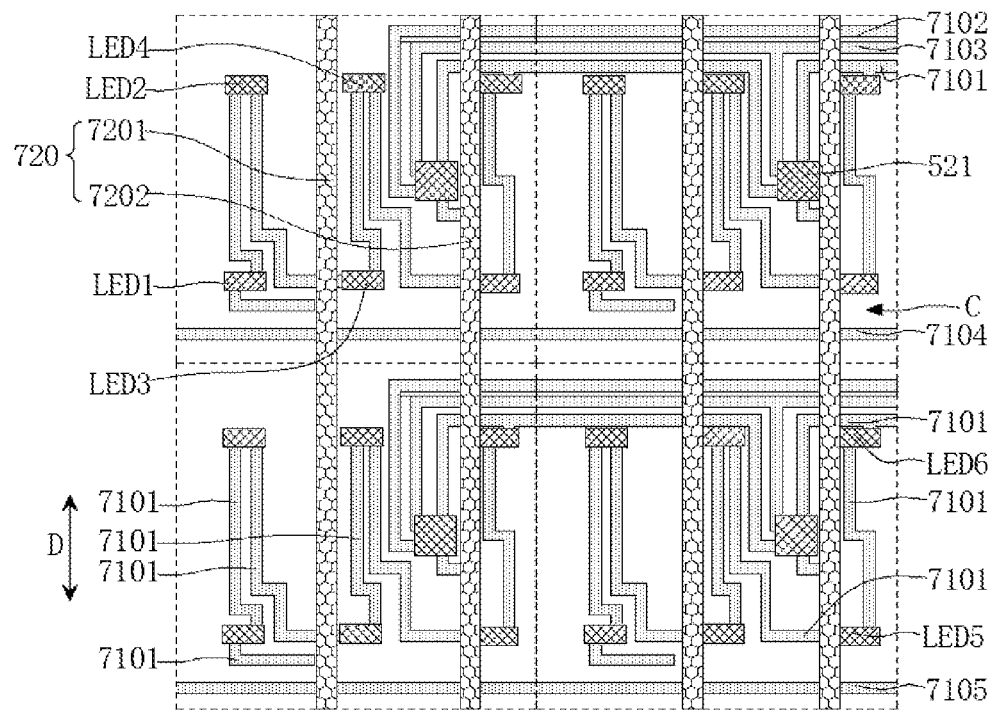
FIG. 17 is a schematic structural diagram of a metal wiring layer, a drive lead layer, a functional device layer, and a drive chip layer of an array substrate according to an embodiment of the present disclosure.

In any functional area C, as shown in FIG. 17 and FIG. 19, the array substrate is provided with a plurality of first connection leads 7101, six functional devices 511 such as LED1~LED6, and the array substrate is further provided with twelve device pads 730, the first to fourth chip pads 7401 to 7404 and the drive chips 521 that are bonded with the six functional devices 511. The six functional devices 511 such as LED1~LED6 are connected in series through the multiple first connection leads 7101. The anode of LED1 is also connected to a first drive lead 7201 through a first connection lead 7101, and the cathode of LED6 is connected to a first chip pad 7401 through a first connection lead 7101. The second chip pad 7402 is electrically connected to a second drive lead 7202 through a first connection lead 7101. The third chip pad 7403 is electrically connected to a third connection lead 7103. In a functional area row C, the fourth chip pad 7404 of the first functional area C is electrically connected to the second connection lead 7102; the fourth chip pads 7404 of the remaining functional areas C are connected to the first chip pad 7401 in the preceding functional area C.

The fourth connection lead 7104 extends along the second direction E and is connected to each first drive lead 7201 through a via hole; the fifth connection lead 7105 extends along the second direction E and is connected to each second drive lead 7202 through a via hole.

Figure 20:
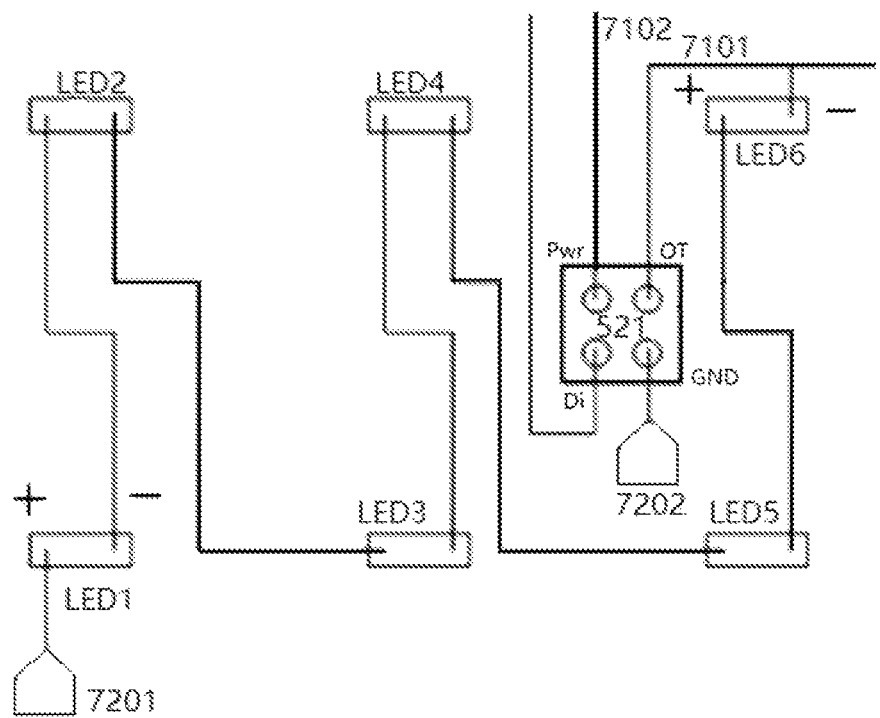
FIG. 20 is an equivalent circuit diagram of an array substrate according to an embodiment of the present disclosure.

As shown in FIG. 20, a drive chip 521 has first to fourth pins. The first pin OT is used for bonding with the first chip pad 7401. The second pin GND is used for bonding with the second chip pad 7402. The third pin Pwr is used for bonding to the third chip pad 7403; the fourth pin Di is used for bonding with the fourth chip pad 7404. The fourth pin Di is used for receiving a first input signal. The first input signal is, for example, an address signal to select the drive chip 521 associated with a corresponding address. For example, the addresses of different drive chips 521 may be the same or different. The first input signal can be an 8-bit address signal, and the address to be transmitted can be obtained by parsing the address signal. The third pin Pwr is used for receiving a second input signal. The second input signal is, for example, a power line carrier communication signal. For example, the second input signal not only provides power to the drive chip 521, but also transmits communication data to the drive chip 521. The communication data can be used to control the light-emitting duration of the corresponding functional device 511, thereby controlling its visual light-emitting brightness. The first pin OT can output different signals in different time periods, for example, the first pin OT can output a relay signal and a drive signal. For example, the relay signal is an address signal provided to another drive chip 521, that is, the fourth pin Di of the another drive chip 521 receives the relay signal as the first input signal, thereby obtaining the address signal. For example, the drive signal may be a drive current for driving the functional device 511 to emit light. The second pin GND receives a common voltage signal, such as a ground signal.

The exemplary array substrate can be manufactured by the following exemplary preparation method:

Step S410 to step S440 are carried out by using high-generation equipment.

In step S410, as shown in FIG. 10, on the first motherboard substrate A including the base substrates 100 of a plurality of array substrates, a molybdenum-niobium alloy material layer (corresponding to the first protective metal material layer, for example, the thickness is 300 angstroms), a copper metal material layer (corresponding to the first copper metal material layer, for example, the thickness is 6000 angstroms), and a copper-nickel alloy material layer (corresponding to the third protective metal material layer, for example, the thickness is 500 angstroms) are sequentially sputter deposited to form the metal wiring material layer of each array substrate. The metal wiring material layer of each array substrate on the first motherboard substrate A is patterned to form the metal wiring layer 200 of each array substrate on the first motherboard substrate A. The metal wiring layer 200 includes a plurality of connection leads 710, a plurality of device pads 730, and a plurality of chip pads 740.

In step S420, as shown in FIG. 11, a silicon nitride layer is deposited by CVD (Chemical Vapor Deposition) on a side of each metal wiring layer 200 on the first motherboard substrate A away from the base substrate 100, and then a photosensitive resin is coated to form a photosensitive resin layer. The photosensitive resin layer is exposed and developed to form the planarization precursor layer 321. The exposed silicon nitride is etched so that the silicon nitride layer is patterned into the first passivation precursor layer 311. In this way, each of the first passivation precursor layer 311 and the planarization precursor layer 321 on the first motherboard substrate A has the third via holes 303.

In step S430, as shown in FIG. 12, a molybdenum-niobium alloy layer (corresponding to the fourth protective metal material layer, for example, the thickness is 300 angstroms) and a copper metal material layer (corresponding to the copper seed material layer, for example, with a thickness of 3000 angstroms) are sequentially supported on a side of each planarization precursor layer 321 on the first motherboard substrate A to form a seed metal material layer. Then, the seed metal material layer is patterned by a photolithography process to form the seed metal layer 410 of each array substrate on the first motherboard substrate A.

In step S440, as shown in FIG. 13, each planarization precursor layer 321 on the first motherboard substrate A is exposed and developed, and the first passivation precursor layer 311 is etched, so that fourth via holes 304 and fifth via holes 305 are formed on the planarization precursor layer 321 and the first passivation precursor layer 311. In this way, the first passivation layer 310 and the planarization layer 320 of each array substrate on the first motherboard substrate A are formed.

In step S450, the first motherboard substrate A is cut into a plurality of second motherboard substrates B, so that the second motherboard substrates B can be applied to middle and low generation equipment. The size of each of the second motherboard substrates B is smaller than that of the first motherboard substrate A. The second motherboard substrate B includes the base substrate 100 of one or more array substrates.

Steps S460 to S470 are carried out on the middle and low generation equipment.

In step S460, as shown in FIG. 14, on the side of each seed metal layer 410 of each second motherboard substrate B away from the base substrate 100, copper metal and copper-nickel alloy are electroplated in sequence to form the copper growth layer 420 and the fifth protective metal layer 430.

In step S470, as shown in FIG. 15, on a side of each fifth protective metal layer 430 of each second motherboard substrate B away from the base substrate 100, white oil is screen printed to form the protective layer 610 of each array substrate on each second motherboard substrate B.

In step S480, as shown in FIG. 16, on a side of each protective layer 610 of each second motherboard substrate B away from the base substrate 100, the functional devices 511 are bonded through the connection structures 620. Each protective layer 610 is bonded to the drive chips 521 on a side of each protective layer 610 on the second motherboard substrate B away from the base substrate 100. In this method, although there is a large segment difference between surfaces of the chip pads 740 and the surface of the drive lead layer 400, for example, the segment difference may reach about 4.4 micrometers, but the step difference does not affect the bonding of the drive chips 521 and the chip pads 740.

Finally, independent array substrates can be obtained by cutting.

An embodiment of the present disclosure also provides a display panel, which includes any of the array substrates described in the above-mentioned array substrate embodiments. The functional devices 511 of the array substrate are micro light emitting diodes or mini light emitting diodes. The display panel can be a mobile phone screen, a TV screen, a smart watch screen, an electronic screen, an electronic billboard or other types of display panels. Since the display panel includes any of the array substrates described in the above-mentioned array substrate embodiments, the display panel has the same beneficial effects, which will not be repeated. According to an exemplary embodiment, the functional devices 511 on the array substrate includes a plurality of micro light emitting diodes or mini light emitting diodes of different colors, such as red micro light emitting diodes or mini light emitting diodes, blue micro light emitting diodes or mini light emitting diodes, and blue micro light emitting diodes or mini light emitting diodes.

An embodiment of the present disclosure also provides a backlight module, which includes any of the array substrates described in the above-mentioned array substrate embodiments. The functional devices 511 of the array substrate are micro light emitting diodes or mini light emitting diodes. The backlight module may be a backlight module of a mobile phone screen, a backlight module of a TV screen, a backlight module of a computer screen, or a backlight module of other type of liquid crystal display panel. Since the backlight module includes any one of the array substrates described in the above-mentioned array substrate embodiments, the backlight module has the same beneficial effects, which will not be repeated.

It should be understood that the present disclosure is not limited to the detailed structures and arrangements that have been described above, and embodiments of the present application may have various modifications, and can be implemented and carried out in variously manners. Such modifications or changes fall within the scope of the present disclosure. The scope of the present disclosure is defined by the appended claims. It should be understood that the present disclosure intends to cover all alternative combinations of two or more individual features mentioned or obvious in the text and/or drawings. All these different combinations constitute multiple alternative aspects of the present disclosure. The specification provides exemplary embodiments for implementing the present disclosure, and will enable those skilled in the art to utilize the present disclosure.

What is claimed is:

1. An array substrate, comprising:
    a base substrate;
    a metal wiring layer provided on a side of the base substrate and comprising a first copper metal layer;
    a planarization layer provided on a side of the metal wiring layer away from the base substrate;
    a drive lead layer provided on a side of the planarization layer away from the base substrate, wherein the drive lead layer is electrically connected to the metal wiring layer, the drive lead layer comprises a second copper metal layer, and a thickness of the second copper metal layer is greater than a thickness of the first copper metal layer; and
    a functional device layer provided on a side of the drive lead layer away from the base substrate, wherein the functional device layer is electrically connected to the metal wiring layer or the drive lead layer.

2. The array substrate according to claim 1, wherein the metal wiring layer comprises a connection lead and a device pad electrically connected to the connection lead;
    wherein the drive lead layer comprises a drive lead electrically connected to the connection lead.

3. The array substrate according to claim 1, wherein the metal wiring layer comprises a connection lead;
    wherein the drive lead layer comprises a drive lead and a device pad, and both the drive lead and the device pad are electrically connected to the connection lead.

4. A backlight module, comprising the array substrate according to claim 1, wherein a functional device in the functional device layer is a micro light emitting diode or a mini light emitting diode.

5. A display panel, comprising the array substrate according to claim 1, wherein a functional device in the functional device layer is a micro light emitting diode or a mini light emitting diode.

6. A method for manufacturing an array substrate, comprising:
    providing a base substrate;
    forming a metal wiring layer on a side of the base substrate, the metal wiring layer comprising a first copper metal layer;
    forming a planarization layer on a side of the metal wiring layer away from the base substrate;
    forming a drive lead layer on a side of the planarization layer away from the base substrate, wherein the drive lead layer is electrically connected to the metal wiring layer, the drive lead layer comprises a second copper metal layer, and a thickness of the second copper metal layer is greater than a thickness of the first copper metal layer; and
    forming a functional device layer on a side of the drive lead layer away from the base substrate, wherein the functional device layer is electrically connected to the metal wiring layer or the drive lead layer.

7. The method for manufacturing the array substrate according to claim 6, wherein forming the metal wiring layer on the side of the base substrate comprises: forming the metal wiring layer on the side of the base substrate, the metal wiring layer comprising a connection lead;
    wherein forming the drive lead layer on the side of the planarization layer away from the base substrate comprises:
    forming the drive lead layer on the side of the planarization layer away from the base substrate, wherein the drive lead layer comprises a drive lead and a device pad, and both the drive lead and the device pad are electrically connected to the connection lead.

8. The method for manufacturing the array substrate according to claim 7, wherein forming the planarization layer on the side of the metal wiring layer away from the base substrate comprises:
forming the planarization layer on the side of the metal wiring layer away from the base substrate, wherein the planarization layer has a first via hole and a second via hole exposing the connection lead;
wherein forming the drive lead layer on the side of the planarization layer away from the base substrate comprises:
forming a seed metal layer on the side of the planarization layer away from the base substrate, wherein the seed metal layer comprises a device pad seed layer and a drive lead seed layer, the device pad seed layer is electrically connected to the connection lead through the first via hole, and the drive lead seed layer is electrically connected to the connection lead through the second via hole;
forming a copper growth layer on a side of the seed metal layer away from the base substrate using an electroless copper plating method, wherein the copper growth layer comprises a device pad growth layer on a surface of the device pad seed layer away from the base substrate and a drive lead growth layer on a surface of the drive lead seed layer away from the base substrate;
wherein the second copper metal layer comprises the copper growth layer and a copper seed layer in the seed metal layer.

9. The method for manufacturing the array substrate according to claim 6, wherein forming the metal wiring layer on the side of the base substrate comprises: forming the metal wiring layer on the side of the base substrate, the metal wiring layer comprising a connection lead and a device pad electrically connected to the connection lead;
wherein forming the drive lead layer on the side of the planarization layer away from the base substrate comprises:
forming the drive lead layer on the side of the planarization layer away from the base substrate, wherein the drive lead layer comprises a drive lead electrically connected to the connection lead.

10. The method for manufacturing the array substrate according to claim 9, wherein forming the drive lead layer on the side of the planarization layer away from the base substrate comprises:
forming a seed metal layer on the side of the planarization layer away from the base substrate, wherein the seed metal layer comprises a drive lead seed layer; and
forming a copper growth layer on a side of the seed metal layer away from the base substrate using a copper electroplating method, wherein the copper growth layer comprises a drive lead growth layer on a surface of the drive lead seed layer away from the base substrate, and wherein the second copper metal layer comprises the copper growth layer and a copper seed layer in the seed metal layer;
wherein forming the planarization layer on the side of the metal wiring layer away from the base substrate comprises:
forming a planarization precursor layer on the side of the metal wiring layer away from the base substrate, wherein the planarization precursor layer has a third via hole exposing the connection lead, so that the seed metal layer is electrically connected to the connection lead through the third via hole; and
after forming the seed metal layer, forming a fourth via hole on the planarization precursor layer, wherein the fourth via hole exposes the device pad.

11. The method for manufacturing the array substrate according to claim 10, wherein forming the metal wiring layer on the side of the base substrate comprises:
forming the metal wiring layer on the side of the base substrate, wherein the metal wiring layer comprises the first copper metal layer and a protective metal layer arranged on a surface of the first copper metal layer away from the base substrate, and a material of the protective metal layer is nickel or copper-nickel alloy;
wherein forming the fourth via hole on the planarization precursor layer comprises:
after forming the seed metal layer and before forming the copper growth layer, forming the fourth via hole on the planarization precursor layer.

12. The method for manufacturing the array substrate according to claim 6, wherein providing the base substrate comprises: providing a first motherboard substrate, wherein the first motherboard substrate comprises base substrates of a plurality of array substrates;
wherein forming the metal wiring layer on the side of the base substrate comprises: forming the metal wiring layer of each of the array substrates on a side of the first motherboard substrate;
wherein forming the planarization layer on the side of the metal wiring layer away from the base substrate comprises: forming the planarization layer of each of the array substrates on the side of each of metal wiring layers away from the base substrate;
wherein forming the drive lead layer on the side of the planarization layer away from the base substrate comprises:
forming the seed metal layer of each of the array substrates on the side of each of planarization layers away from the base substrate;
after forming the seed metal layer, dividing the first motherboard substrate into a plurality of second motherboard substrates, wherein any one of the second motherboard substrates comprises the base substrate of at least one of the array substrates; and
forming a copper growth layer of each of the array substrates on a side of each of seed metal layers of the second motherboard substrates away from the base substrate;
wherein the second copper metal layer comprises the copper growth layer and a copper seed layer in the seed metal layer.

* * * * *